(12) United States Patent
Kim et al.

(10) Patent No.: US 10,319,858 B2
(45) Date of Patent: Jun. 11, 2019

(54) SEMICONDUCTOR DEVICES HAVING LOWER AND UPPER FINS AND METHOD FOR FABRICATING THE SAME

(71) Applicant: Samsung Electronics Co., Ltd., Suwon-si, Gyeonggi-do (KR)

(72) Inventors: Sung-Min Kim, Incheon (KR); Kyung-Seok Oh, Seoul (KR); Cheol Kim, Hwaseong-si (KR); Heon-Jong Shin, Yongin-si (KR); Jong-Ryeol Yoo, Osan-si (KR); Hyun-Jung Lee, Suwon-si (KR); Seong-Hoon Jeong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/128,152

(22) Filed: Sep. 11, 2018

(65) Prior Publication Data

US 2019/0013401 A1 Jan. 10, 2019

Related U.S. Application Data

(63) Continuation of application No. 14/690,575, filed on Apr. 20, 2015, now Pat. No. 10,103,266.

(30) Foreign Application Priority Data

Jul. 7, 2014 (KR) .......................... 10-2014-0084463

(51) Int. Cl.
| | |
|---|---|
| *H01L 21/84* | (2006.01) |
| *H01L 27/12* | (2006.01) |
| *H01L 29/66* | (2006.01) |
| *H01L 29/78* | (2006.01) |

(52) U.S. Cl.
CPC .......... *H01L 29/785* (2013.01); *H01L 21/845* (2013.01); *H01L 27/1211* (2013.01); *H01L 29/66795* (2013.01)

(58) Field of Classification Search
CPC ............... H01L 21/845; H01L 27/1211; H01L 29/66795; H01L 29/785
See application file for complete search history.

(56) References Cited

U.S. PATENT DOCUMENTS

| | | | |
|---|---|---|---|
| 6,936,875 | B2 | 8/2005 | Sugii |
| 7,605,025 | B2 | 10/2009 | Kim |
| 7,608,868 | B2 | 10/2009 | Lee |
| 7,683,406 | B2 | 3/2010 | Lee |
| 7,795,678 | B2 | 9/2010 | Park |

(Continued)

FOREIGN PATENT DOCUMENTS

| | | |
|---|---|---|
| JP | 2009170880 | 7/2009 |
| JP | 2009176856 | 8/2009 |

(Continued)

*Primary Examiner* — Bilkis Jahan
*Assistant Examiner* — Victor V Barzykin
(74) *Attorney, Agent, or Firm* — Myers Bigel, P.A.

(57) ABSTRACT

Provided are a semiconductor device and a method for fabricating the same. The semiconductor device includes a lower fin that protrudes from a substrate and extends in a first direction, an oxide film the lower fin, an upper fin that protrudes from the oxide film and that is spaced apart from the lower fin at a position corresponding to the lower fin, and a gate structure the upper fin that extends in a second direction to intersect the upper fin, wherein germanium (Ge) is included in a portion of the oxide film located between the lower fin and the upper fin.

20 Claims, 32 Drawing Sheets

(56) References Cited

U.S. PATENT DOCUMENTS

| | | | |
|---|---|---|---|
| 8,426,901 | B2 | 4/2013 | Oh |
| 2011/0147697 | A1 | 6/2011 | Shah |
| 2013/0001591 | A1 | 1/2013 | Wu |
| 2015/0008483 | A1 | 1/2015 | Ching |
| 2015/0200300 | A1 | 7/2015 | Ching |

FOREIGN PATENT DOCUMENTS

| | | |
|---|---|---|
| KR | 20020058280 | 7/2002 |
| KR | 20050107090 | 11/2005 |

SEMICONDUCTOR DEVICES HAVING LOWER AND UPPER FINS AND METHOD FOR FABRICATING THE SAME

CROSS-REFERENCE TO RELATED APPLICATION

The present application is a continuation application of and claims priority from U.S. patent application Ser. No. 14/690,575, filed Apr. 20, 2015 which claims priority under 35 U.S.C. § 119 from Korean Patent Application No. 10-2014-0084463, filed on Jul. 7, 2014 in the Korean Intellectual Property Office, the entire contents of which are hereby incorporated herein by reference in their entireties.

BACKGROUND

Field-effect transistors are now available that exhibit high-speed operation at low operating voltages and that have a high integration density. In order to more efficiently withstand a short channel effect and provide a higher drive current at low operating voltages as compared to a conventional field-effect transistor, there is a rising interest in fin field effect transistors (FinFET) which have channels that are formed in a three-dimensional structure.

In recent years, in order to improve the performance of the semiconductor device, there has been used a technique in which a layer including a stress material is formed by epitaxial growth to increase the carrier mobility of a channel region of the semiconductor device.

SUMMARY

An aspect of the inventive concepts provides a semiconductor device having a Fin On Insulator (FOI) structure which may provide improved operating characteristics in a FinFET device. The FOI structure may be formed, for example, using a difference in oxidation rate between silicon (Si) and silicon germanium (SiGe).

Another aspect of the inventive concepts provides a method for fabricating a semiconductor device having an FOI structure using a difference in oxidation rate between silicon (Si) and silicon germanium (SiGe).

However, aspects of the present inventive concept are not restricted to the above. The above and other aspects of the inventive concepts will become more apparent to one of ordinary skill in the art to which the inventive concepts pertain by referencing the detailed description below.

According to one aspect of the inventive concepts, there is provided a semiconductor device having a lower fin that protrudes upwardly from a substrate and that extends in a first direction, an oxide film on the lower fin, an upper fin that extends in the first direction above the lower fin, the upper fin protruding upwardly from the oxide film and spaced apart from the lower fin, and a gate structure on the upper fin that extends in a second direction to intersect the upper fin, wherein germanium (Ge) is included in a portion of the oxide film that is between the lower fin and the upper fin.

According to another aspect of the inventive concepts, there is provided a semiconductor device that includes a substrate having a first region and a second region, a lower fin that protrudes from the first region of the substrate and that extends in a first direction, a first oxide film on the lower fin, an upper fin that extends in the first direction, that protrudes from the first oxide film, and that is above and spaced apart from the lower fin, a first gate structure on the upper fin that extends in a second direction, a fin structure formed protruding from the second region of the substrate that extends in the first direction, a second oxide film on the substrate covering at least a portion of a sidewall of the fin structure, and a second gate structure that extends in the second direction on the fin structure, wherein a material which is not included in the second oxide film is included in the first oxide film.

According to yet another aspect of the inventive concepts, a semiconductor device is provided that includes a first lower fin that extends in a first direction; a second lower fin that extends in the first direction that is spaced apart from the first lower fin; an oxide layer that covers sides surfaces and top surfaces of the first lower fin and the second lower fin; a first upper fin on the oxide layer, the first upper fin extending in the first direction above the first lower fin and spaced apart from the first lower fin; a second upper fin on the oxide layer, the second upper fin extending in the first direction above the second lower fin and spaced apart from the second lower fin, wherein the oxide layer includes a first portion that is between the first lower fin and the first upper fin that includes a first material, a second portion that is between the second lower fin and the second upper fin that includes the first material, and a third portion that is between the first portion and the second portion that does not include the first material.

According to still another aspect of the inventive concepts, there is provided a method for fabricating a semiconductor device that includes preparing a substrate that has a fin structure that includes a first material layer and a second material layer protruding upwardly therefrom, forming an oxide film on the substrate to cover at least a portion of the fin structure, annealing the fin structure to convert the fin structure into a lower fin and an upper fin that is spaced apart from the lower fin, removing a portion of the oxide film, and forming a gate structure on the upper fin that intersects the upper fin.

BRIEF DESCRIPTION OF THE DRAWINGS

The above and other aspects and features of the inventive concepts will become more apparent by describing in detail exemplary embodiments thereof with reference to the attached drawings, in which.

DETAILED DESCRIPTION OF THE EMBODIMENTS

Figure 1:
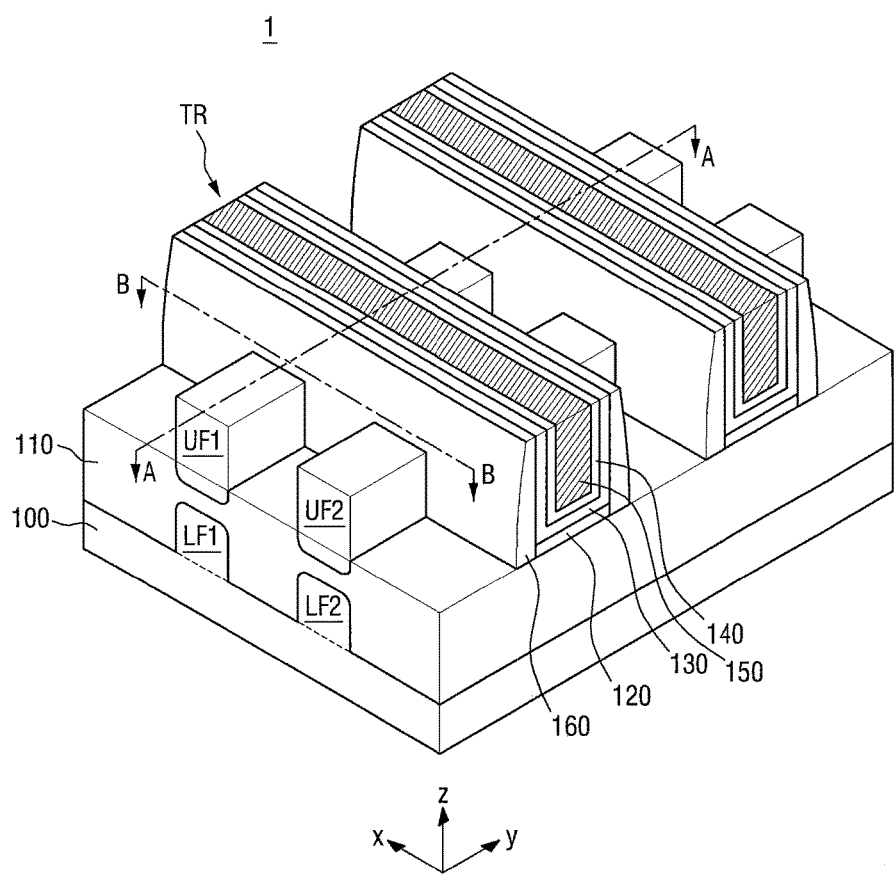
FIG. 1 is a perspective view of a semiconductor device according to a first embodiment of the inventive concepts.

The inventive concepts will now be described more fully hereinafter with reference to the accompanying drawings, in which preferred embodiments are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified.

The inventive concepts will be described with reference to perspective views, cross-sectional views, and/or plan views, in which example embodiments are shown. Thus, the profile of an exemplary view may be modified according to manufacturing techniques and/or allowances. That is, the embodiments described herein are not intended to limit the scope of the inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, a semiconductor device 1 according to a first embodiment of the inventive concepts will be described.

Figure 2:
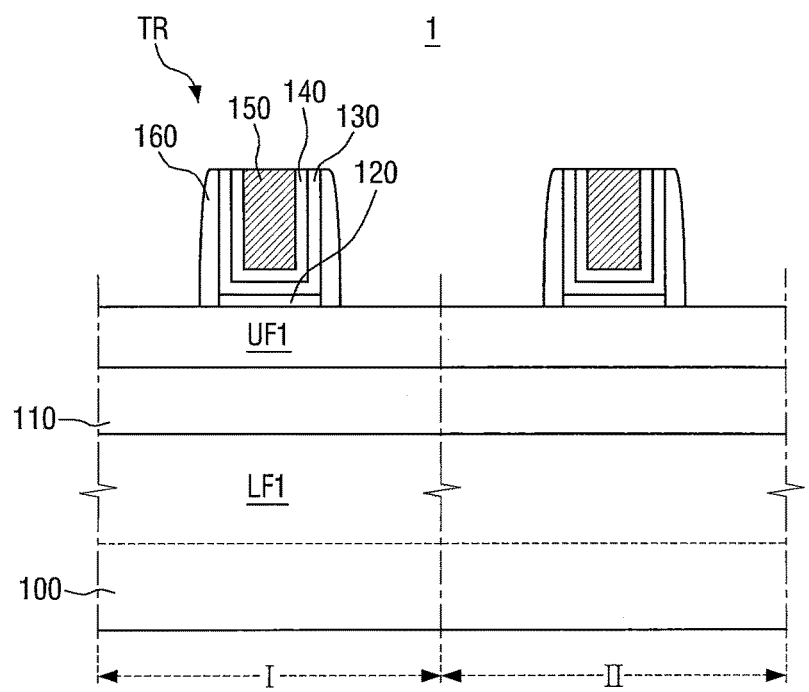
FIG. 2 is a cross-sectional view taken along line A-A of FIG. 1.
Figure 3:
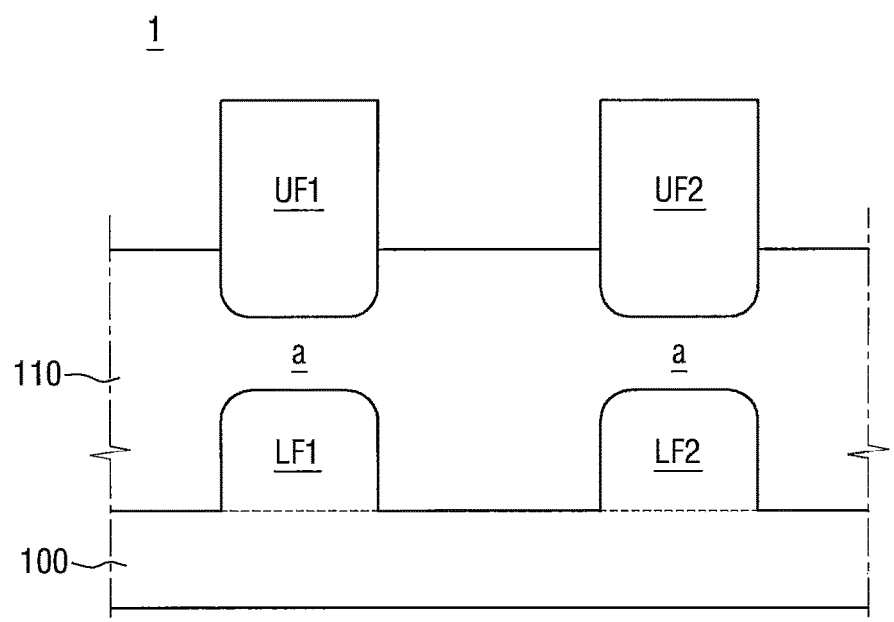
FIG. 3 is a cross-sectional view taken along line B-B of FIG. 1.

FIG. 1 is a perspective view of the semiconductor device 1. FIG. 2 is a cross-sectional view taken along line A-A of FIG. 1. FIG. 3 is a cross-sectional view taken along line B-B of FIG. 1.

Referring to FIGS. 1 to 3, the semiconductor device 1 includes a substrate 100, an oxide film 110, lower fins LF1 and LF2, upper fins UF1 and UF2, gate structures TR and the like.

The substrate 100 may be a rigid substrate such as a silicon substrate, a silicon on insulator (SOI) substrate, a gallium arsenide substrate, a silicon germanium substrate, a ceramic substrate, a quartz substrate, or a glass substrate for a display, or a flexible plastic substrate such as polyimide, polyether, polycarbonate, polyethersulfone, polymethylmethacrylate, polyethylene naphthalate or polyethyleneterephthalate substrates.

The substrate 100 may include a first region I and a second region II. The first region I and the second region II may be separated by a device isolation film (not shown) formed by, for example, shallow trench isolation (STI). The first region I may be a PMOS region and the second region II may be an NMOS region, but inventive concepts are not limited thereto. The first region I may be an NMOS region, and the second region II may be a PMOS region.

The lower fins LF1 and LF2 may protrude upwardly from the substrate 100 and extend in a second direction Y. The lower fins LF1 and LF2 may be part of the substrate 100.

The oxide film 110 may be formed on the lower fins LF1 and LF2. The oxide film 110 may be formed on the substrate 100 to cover the side surfaces and the upper surfaces of the lower fins LF1 and LF2. In order to form a fin-on-insulator (FOI) structure, the oxide film 110 may be formed to cover the entire upper surfaces of the lower fins LF1 and LF2.

The oxide film 110, which may act as an insulating film, may be a HDP oxide film, a SOG oxide film, a CVD oxide film or the like, but is not limited thereto.

The upper fins UF1 and UF2 may protrude upwardly from the oxide film 110 and may be formed at positions corresponding to the lower fins LF1 and LF2 to be spaced apart from the lower fins LF1 and LF2. As shown in FIGS. 1 and 3, the upper fins UF1 and UF2 may substantially vertically overlap the lower fins LF1 and LF2, respectively. Since the upper fins UF1 and UF2 are formed at positions corresponding to the lower fins LF1 and LF2, the upper fins UF1 and UF2 may also extend in the second direction Y. Further, since the upper fins UF1 and UF2 protrude upwardly from the oxide film 110 and are spaced apart from the lower fins LF1 and LF2, the semiconductor device may have a fin shape having a FOI structure.

As shown in FIGS. 1 and 3, the upper fins UF1 and UF2 may be partially recessed into an upper surface of the oxide film 110.

In the semiconductor device 1, a silicon germanium (SiGe) layer may be formed between two silicon (Si) layers, and the silicon germanium (SiGe) layer may then be oxidized to form a portion of the oxide film 110. Accordingly, germanium (Ge) is included in portions a and a' of the oxide film 110 that are located, respectively, between the lower fin LF1 and the upper fin UF1 and between the lower fin LF2 and the upper fin UF2.

The oxidation rate of silicon germanium (SiGe) is higher than the oxidation rate of silicon (Si). Accordingly, when the silicon germanium (SiGe) layer that is formed between the two silicon (Si) layers is annealed under oxidizing conditions, the silicon germanium (SiGe) layer may be oxidized to form an insulating film, but the silicon (Si) layer may not be oxidized.

Since the FOI structure is formed by performing such an annealing process, the silicon (Si) layers that form the lower fins LF1 and LF2 and the upper fins UF1 and UF2 are not oxidized, while the silicon germanium (SiGe) layer is converted into the portions a and a' of the oxide film 110 that are located between the lower fins LF1 and LF2 and the upper fins UF1 and UF2. Accordingly, germanium (Ge) is present in the portions a and a' of the oxide film 110.

The gate structure TR may be formed on the upper fins UF1 and UF2. The gate structure TR may extend in a first direction and may intersect the upper fins UF1 and UF2. The first direction may be the X direction.

The gate structure TR may include an interface film 120, a gate insulating film 130, a work function adjusting film 140, gate metal 150, a gate spacer 160 and the like, which may be sequentially formed on the upper fins UF1 and UF2. In the semiconductor device 1, a channel may be formed on both side surfaces and upper surfaces of the upper fins UF1 and UF2.

The interface film 120 may be formed on the oxide film 110 and on side surfaces and upper surfaces of the upper fins UF1 and UF2. The interface film 120 may improve the interface between the oxide film 110 and the gate insulating film 130.

The interface film 120 may include a low-k material layer having a dielectric constant k which is equal to or less than 9. For example, the interface film 120 may be a silicon oxide film (k is about 4) or a silicon oxynitride film (k is about 4 to 8 depending upon the content of oxygen atoms and nitrogen atoms). In other embodiments, the interface film 120 may be formed of silicate, or a combination of the films mentioned above.

The gate insulating film 130 may be formed on the interface film 120. However, if the interface film 120 is not present, the gate insulating film 130 may be formed directly on the oxide film 110 and the upper fins UF1 and UF2.

The gate insulating film 130 may include a high-k material. For example, the gate insulating film 130 may be any one selected from the group consisting of HfSiON, $HfO_2$, $ZrO_2$, $Ta_2O_5$, $TiO_2$, $SrTiO_3$, $BaTiO_3$ and $SrTiO_3$.

The gate insulating film 130 may have an appropriate thickness based on the type of a device to be formed. For example, if the gate insulating film 130 includes $HfO_2$, the gate insulating film 130 may have a thickness of about 50 Å or less (about 5 Å to 50 Å), but is not limited thereto.

According to some embodiments of the inventive concepts, as shown in FIG. 1, the gate insulating film 130 may extend upward along the sidewall of the gate spacer 160, which will be described later.

The work function adjusting film 140 may be formed on the gate insulating film 130. The work function adjusting film 140 may directly contact the gate insulating film 130. The work function adjusting film 140 may also extend upward along the sidewall of the gate spacer 160. The work function adjusting film 140 is used for adjusting a work function.

The work function adjusting film 140 may include, for example, metal nitride. Specifically, the work function adjusting film 140 may include at least one of Mo, Pd, Ru, Pt, TiN, WN, TaN, Ir, TaC, RuN, TiAl, TaAlC, TiAlN and MoN. The work function adjusting film 140 may be formed of a single film including TiN, a double film including a lower TiN film and an upper TaN film, or the like, but the inventive concepts are not limited thereto.

The gate metal 150 may be formed on the work function adjusting film 140. As illustrated, the gate metal 150 may directly contact the work function adjusting film 140. That is, the gate metal 150 may fill a space defined by the work function adjusting film 140. The gate metal 150 may include a conductive material, for example, W or Al, but is not limited thereto.

The gate spacer 160 may be formed on at least one side of the side surfaces of the gate structure TR. The gate spacer 160 may include at least one of a nitride film, an oxynitride film and a low-k material.

Further, although the outer side surface of the gate spacer 160 is illustrated as having a curved shape, the inventive concepts are not limited thereto. For example, the gate spacer 160 may have an I shape or L shape in further embodiments.

Further, although the gate spacer 160 is illustrated as a single layer in the drawings, it will be appreciated that the gate spacer 160 may alternatively include a plurality of layers.

A source/drain is formed on one side of both sides of the gate structure TR. The source/drain(s) may be formed in the upper fins UF1 and UF2. The gate spacer 160 may insulate the source/drain from the gate structure TR.

Hereinafter, semiconductor devices according to other embodiments of the inventive concepts will be described.

Figure 4:
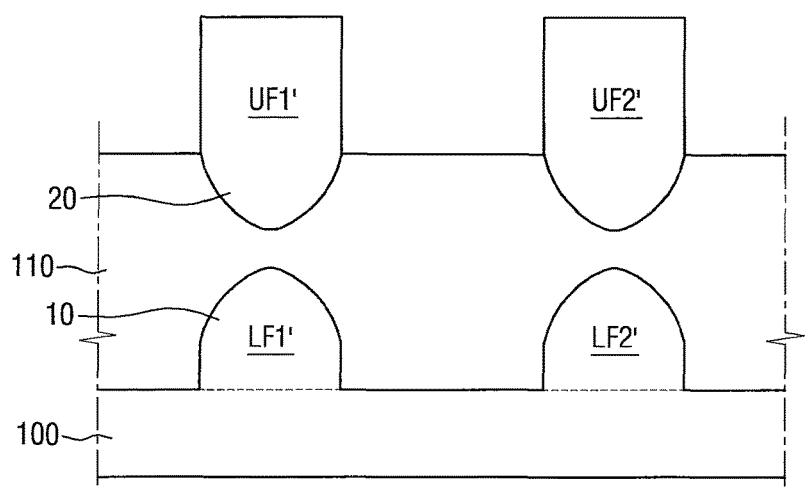
FIG. 4 is a cross-sectional view of a semiconductor device according to a second embodiment of the inventive concepts.

FIG. 4 is a cross-sectional view of a semiconductor device 2 according to a second embodiment of the inventive concepts. For simplicity of description, a description of substantially the same parts as those included in the semiconductor device 1 will be omitted.

Referring to FIG. 4, in the semiconductor device 2, the upper surface of a lower fin LF1' may have a first tip portion 10, and the lower surface of an upper fin UF1' may have a second tip portion 20.

After the silicon germanium (SiGe) layer is formed between the two silicon (Si) layers, a first annealing process is performed under oxidizing conditions to oxidize the silicon germanium (SiGe) layer.

The silicon (Si) layer on the lower side of the silicon germanium (SiGe) layer is formed as the lower fin LF1', and the silicon (Si) layer on the upper side of the silicon germanium (SiGe) layer is formed as the upper fin UF1'. The silicon germanium (SiGe) layer is oxidized to form the portions of the oxide film 110 that are between the lower fin LF1' and the upper fin UF1'. This result is obtained because the oxidation rate of the silicon germanium (SiGe) layer is higher than the oxidation rate of the silicon (Si) layer.

As a result of performing the first annealing process, the upper surface of the lower fin LF1' may have the first tip portion 10 and the lower surface of the upper fin UF1' may have the second tip portion 20.

That is, each of the first tip portion 10 and the second tip portion 20 is an end portion of the fin and may have a substantially pointed shape. However, the shape of the first tip portion 10 and the second tip portion 20 is not limited to the shape shown in FIG. 4, and may, for example, have an irregular bent portion according to the process conditions.

The first annealing process may form the FOI structure in which the lower fin LF1' and the upper fin UF1' are completely separated by the oxidized silicon germanium (SiGe) layer.

Figure 5:
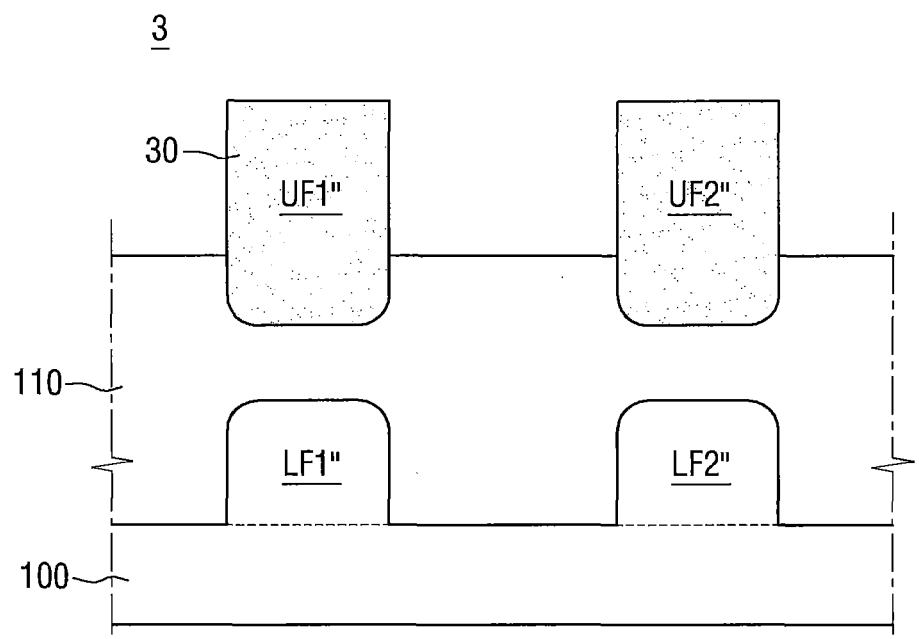
FIG. 5 is a cross-sectional view of a semiconductor device according to a third embodiment of the inventive concepts.

FIG. 5 is a cross-sectional view of a semiconductor device 3 according to a third embodiment of the inventive concepts. For simplicity of description, a description of substantially the same parts as those of the semiconductor device 1 will be omitted.

Referring to FIG. 5, in the semiconductor device 3, a lower fin LF1" and an upper fin UF1" may be made of different materials.

For example, the lower fin LF1" may be made of silicon (Si) that is an original material, and the upper fin UF1" may include a first material 30. In this case, the first material 30 may be germanium (Ge), but is not limited thereto.

After forming the lower fin LF1" and the upper fin UF1" by annealing the device under oxidizing conditions, silicon (Si) that forms the upper fin UF1" may be removed, and an epitaxial layer may be formed using the silicon germanium (SiGe) layer that remains below the upper fin UF1" as a seed layer. Thus, the upper fin UF1" may be formed as an epitaxial layer that includes germanium (Ge).

In a PMOS region of a FinFET device, the upper fin UF1" may be formed as an epitaxial layer that includes germanium (Ge) to provide a compressive stress to a channel region. However, the inventive concepts are not limited thereto, and the upper fin UF1" may be formed to include a different material if necessary.

Figure 6:
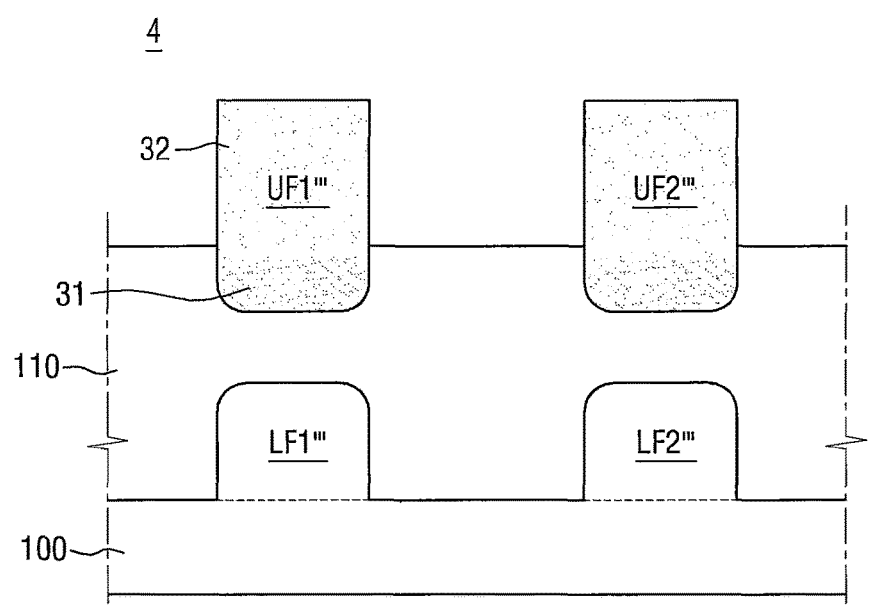
FIG. 6 is a cross-sectional view of a semiconductor device according to a fourth embodiment of the inventive concepts.

FIG. 6 is a cross-sectional view of a semiconductor device 4 according to a fourth embodiment of the inventive concepts. For simplicity of description, a description of substantially the same parts as those of the semiconductor device 1 will be omitted.

Referring to FIG. 6, in the semiconductor device 4, an upper fin UF1''' may include a second material layer 31 and a third material layer 32 which are different materials.

The second material layer 31 and the third material layer 32 may be made of different materials than the material of the lower fin LF1'''.

For example, the lower fin LF1''' may be made of silicon (Si) that is an original material, the second material layer 31 of the upper fin UF1''' may be made of a material including germanium (Ge), and the third material layer 32 of the upper fin UF1''' may include a III-V group compound semiconductor material. However, these materials are merely exemplary, and the inventive concepts are not limited thereto.

After forming the lower fin LF1''' and the upper fin UF1''' by annealing the device under oxidizing conditions, the silicon (Si) that forms the upper fin UF1''' may be removed, and an epitaxial process may be performed using the silicon germanium (SiGe) layer remaining below the upper fin UF1''' as a seed layer. Thus, the upper fin UF1''' may be formed as a first epitaxial layer that includes germanium (Ge) and as a second epitaxial layer that includes a III-V group compound semiconductor material.

Accordingly, the lower fin LF1''' may include silicon (Si), the second material layer 31 of the upper fin UF1''' may include germanium (Ge), and the third material layer 32 of the upper fin UF1''' may include a III-V group compound semiconductor material.

Figure 7:
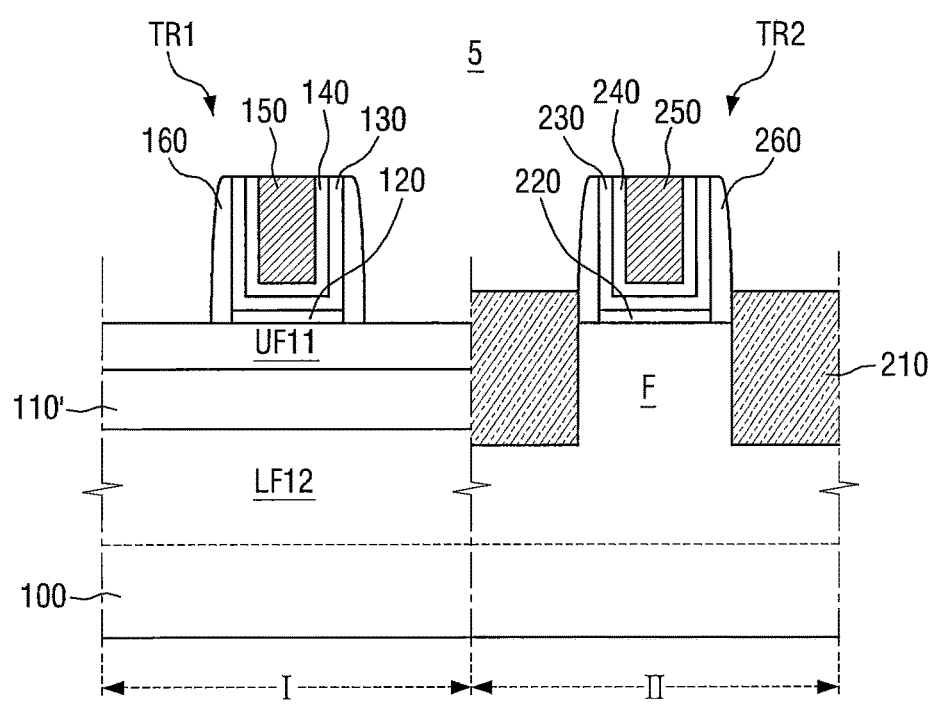
FIGS. 7 and 8 are cross-sectional views of a semiconductor device according to a fifth embodiment of the inventive concepts.
Figure 8:
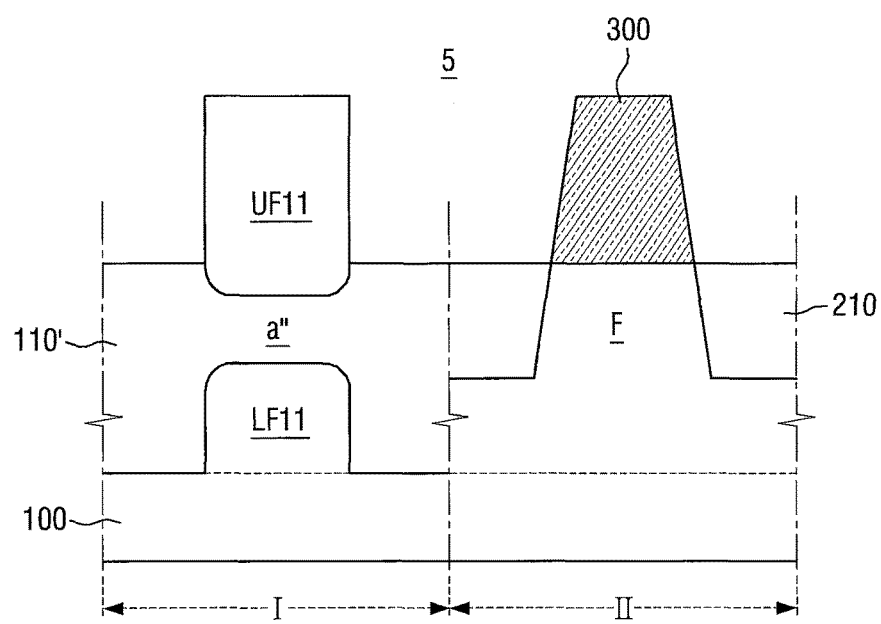

FIGS. 7 and 8 are cross-sectional views of a semiconductor device 5 according to a fifth embodiment of the inventive concepts. For simplicity of description, a description of substantially the same parts as those of the semiconductor device 1 will be omitted.

Referring to FIGS. 7 and 8, the semiconductor device 5 includes a substrate 100 in which a first region I and a second region II are defined, a lower fin LF11, a first oxide film 110', an upper fin UF11, a first gate structure TR1, a fin structure F, a second oxide film 210, a second gate structure TR2 and the like.

The lower fin LF11 may protrude from the first region I of the substrate 100 and extend in a first direction. The lower fin LF11 may be part of the substrate 100.

The first oxide film 110' may be formed on the lower fin LF11. As shown in FIG. 8, the first oxide film 110' may be formed on the substrate 100 to cover the side surfaces and the upper surface of the lower fin LF11. In order to form a FOI structure on the first region I of the substrate 100, the first oxide film 110' may cover the entire upper surface of the lower fin LF11.

The first oxide film 110' may serve as an insulating film and may be an HDP oxide film, a SOG oxide film, a CVD oxide film or the like, but is not limited thereto.

The upper fin UF11 may protrude from the first oxide film 110' and may be formed at a position corresponding to the lower fin LF11 and may be spaced apart from the lower fin LF11. Since the upper fin UF11 is formed at the position corresponding to the lower fin LF11, the upper fin UF11 may also extend in the first direction. The upper fin UF11 may be vertically aligned with the lower fin LF11. The upper fin UF11 may be recessed within the first oxide film 110'.

In the semiconductor device 5, after a silicon germanium (SiGe) layer is formed between two silicon (Si) layers, the silicon germanium (SiGe) layer is oxidized to form at least a portion of the first oxide film 110'. Accordingly, germanium (Ge) is included in a portion a" of the first oxide film 110' that is located between the lower fin LF11 and the upper fin UF11.

When the silicon (Si) layer and the silicon germanium (SiGe) layer are oxidized by performing an annealing process one or more times under oxidizing conditions, the silicon germanium (SiGe) layer is converted into an oxide film that serves as an insulating film, but the silicon (Si) layer is not oxidized into an insulating film.

Since the FOI structure is formed by performing such a process, the silicon (Si) layers are formed as the lower fin LF11 and the upper fin UF11, and the silicon germanium (SiGe) layer becomes the portion a" of the first oxide film 110' that is located between the lower fin LF11 and the upper fin UF11. Accordingly, germanium (Ge) is present in the portion a" of the first oxide film 110'.

The first gate structure TR1 may be formed on the upper fin UF11 in a second direction that intersects the upper fin UF11. The first gate structure TR1 may include an interface film 120, a gate insulating film 130, a work function adjusting film 140, gate metal 150, a gate spacer 160 and the like, which are sequentially formed on the upper fin UF11. A channel may be formed on both side surfaces and an upper surface of the upper fin UF11. The interface film 120, the gate insulating film 130, the work function adjusting film 140, the gate metal 150 and the gate spacer 160 may be substantially the same as those described above with reference to FIGS. 1-2.

The fin structure F may protrude from the second region II of the substrate 100 and extend in the first direction. The fin structure F may be part of the substrate 100.

The second oxide film 210 may cover the side surfaces of the fin structure F. The second oxide film 210, which serves as an insulating film, may be a HDP oxide film, a SOG oxide film, a CVD oxide film or the like, but is not limited thereto.

An upper portion of the fin structure F may be formed as an epitaxial layer 300. The epitaxial layer 300 may be formed of a material which provides a compressive stress to a channel region. However, the inventive concepts are not limited thereto, and the epitaxial layer 300 may be formed of a material which provides a tensile stress if necessary.

The gate structure TR2 may be formed on the fin structure F in a direction to intersect the fin structure F. The gate structure TR2 may include an interface film 220, a gate insulating film 230, a work function adjusting film 240, gate metal 250, a gate spacer 260 and the like, which are sequentially formed on the fin structure F.

The interface film 220, the gate insulating film 230, the work function adjusting film 240, the gate metal 250 and the gate spacer 260 may be substantially the same as the interface film 120, the gate insulating film 130, the work function adjusting film 140, the gate metal 150 and the gate spacer 160, respectively, that are described above with reference to FIGS. 1-2.

In the semiconductor device 5, the FOI structure is formed on the first region I of the substrate 100, and the silicon germanium (SiGe) layer is oxidized to form the portion a" of the first oxide film 110' that serves as an insulating film. Thus, a material included in the first oxide film 110' may be different from a material included in the second oxide film 210.

That is, a material which is not included in the second oxide film 210 may be included in the first oxide film 110'. This material may be, for example, germanium (Ge).

Figure 9:
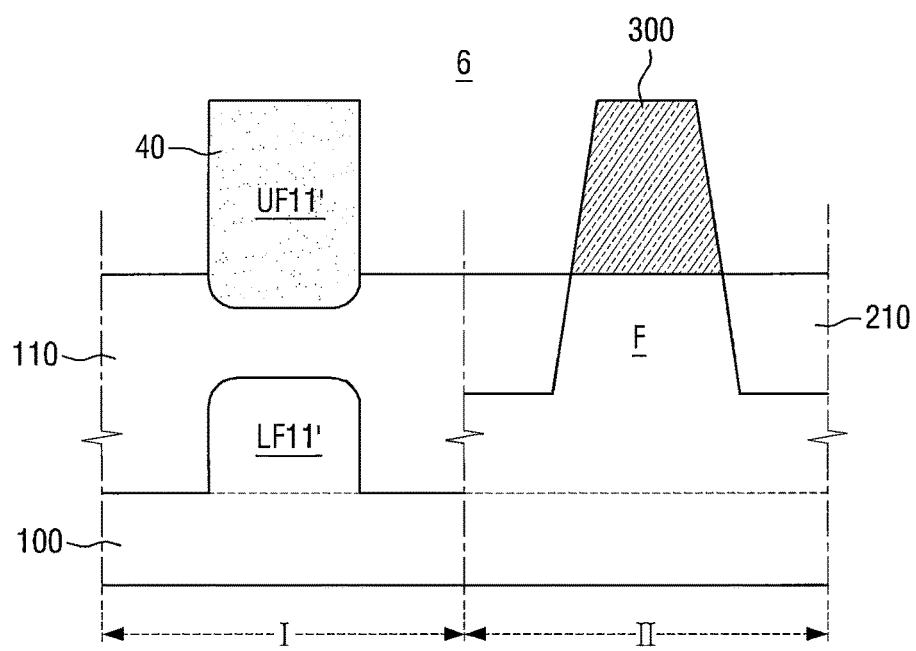
FIG. 9 is a cross-sectional view of a semiconductor device according to a sixth embodiment of the inventive concepts.

FIG. 9 is a cross-sectional view of a semiconductor device 6 according to a sixth embodiment of the inventive concepts. For simplicity of description, a description of substantially the same parts as those of the semiconductor devices 1, 5 according to the first and fifth embodiments will be omitted.

Referring to FIG. 9, in the semiconductor device 6, a lower fin LF11' and an upper fin UF11' that are made of different materials are formed on the first region I of the substrate 100.

For example, the lower fin LF11' may be made of silicon (Si) that is an original material, and the upper fin UF11' may be made of a material including a fourth material 40. In this case, the fourth material 40 may be germanium (Ge), but is not limited thereto.

That is, after forming the lower fin LF11' and the upper fin UF11' by performing the annealing process a plurality of times, silicon (Si) forming the upper fin UF11' may be removed, and an epitaxial process may be performed using the silicon germanium (SiGe) layer remaining below the upper fin UF11' as a seed layer. Thus, the upper fin UF11' may be formed as an epitaxial layer that includes germanium (Ge).

For example, if the first region I is a PMOS region, the upper fin UF11' may be formed as an epitaxial layer that includes germanium (Ge) to provide a compressive stress to a channel region.

Figure 10:
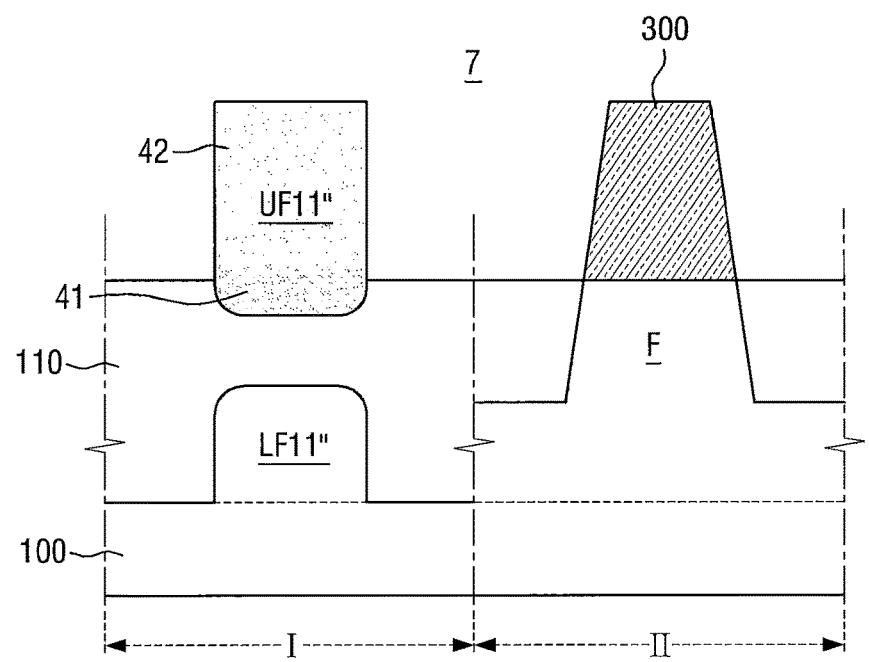
FIG. 10 is a cross-sectional view of a semiconductor device according to a seventh embodiment of the inventive concepts.

FIG. 10 is a cross-sectional view of a semiconductor device 7 according to a seventh embodiment of the inventive concepts. For simplicity of description, a description of substantially the same parts as those of the semiconductor devices 1, 5 according to the first and fifth embodiments of the inventive concepts will be omitted.

Referring to FIG. 10, in the semiconductor device 7, an upper fin UF11" may include a fifth material layer 41 and a sixth material layer 42 which are made of different materials.

The fifth material layer 41 and the sixth material layer 42 may be made of different materials than the material of the lower fin LF11".

For example, the lower fin LF11" may be made of silicon (Si) that is an original material, the fifth material layer 41 of the upper fin UF11" may be made of a material that includes germanium (Ge), and the sixth material layer 42 of the upper fin UF11" may include a III-V group compound semiconductor material. However, these materials are merely exemplary, and the inventive concepts are not limited thereto.

After forming the lower fin LF11" and the upper fin UF11" by performing the annealing process, silicon (Si) forming the upper fin UF11" may be removed, and an epitaxial process may be performed using the silicon germanium (SiGe) layer remaining below the upper fin UF11" as a seed layer. Thus, the upper fin UF11" may be formed as an epitaxial layer including the III-V group compound semiconductor material.

Accordingly, the lower fin LF11" may include silicon (Si), the fifth material layer 41 of the upper fin UF11" may include germanium (Ge), and the sixth material layer 42 of the upper fin UF11" may include a III-V group compound semiconductor material.

Figure 11:
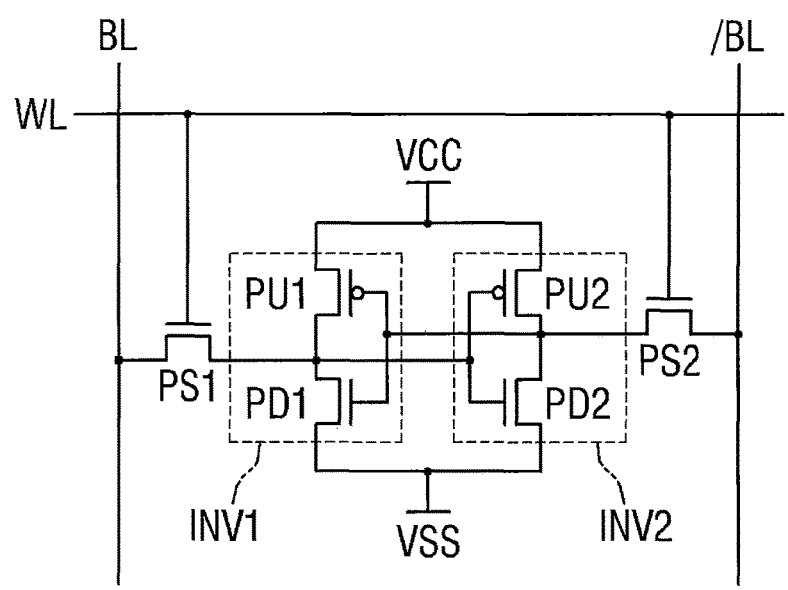
FIGS. 11 to 13 are circuit and layout diagrams of a semiconductor device according to an eighth embodiment of the inventive concepts.
Figure 12:
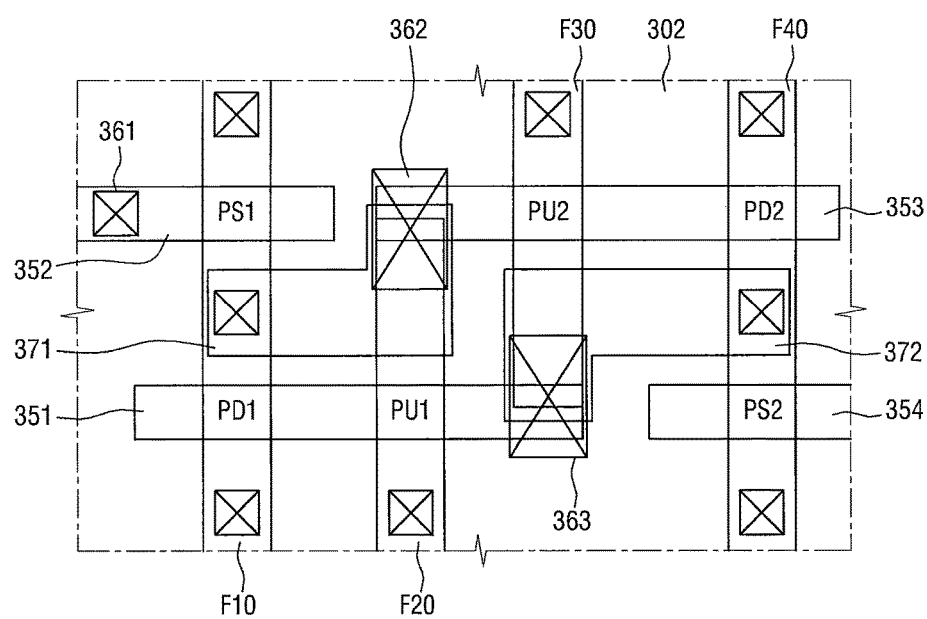
Figure 13:
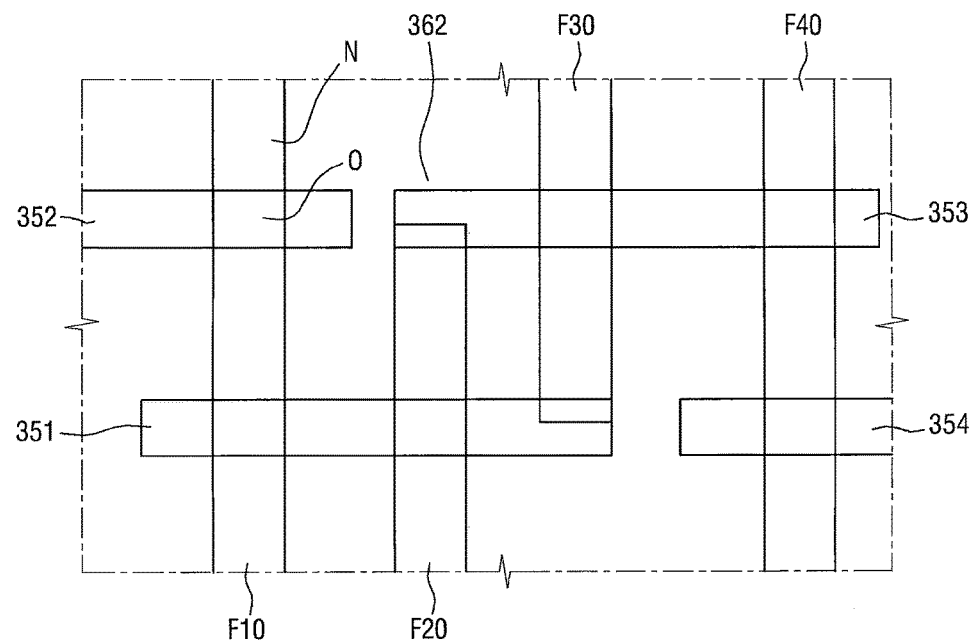

FIGS. 11 to 13 are circuit and layout diagrams illustrating a semiconductor device according to an eighth embodiment of the inventive concepts.

FIGS. 11 and 12 are a circuit diagram and a layout diagram, respectively, of the semiconductor device according to the eighth embodiment of the inventive concepts. FIG. 13 illustrates only a plurality of fins and a plurality of gate structures in the layout diagram of FIG. 12. The above-described semiconductor devices according to embodiments of the inventive concepts may be applied to any device configured as a general logical device using a fin type transistor, but a SRAM is illustrated as an example in FIGS. 11 to 13.

Referring to FIGS. 12 and 13, the semiconductor device according to the eighth embodiment of the inventive concepts includes a first active fin F10 that is formed in a first direction, and a second gate line 352 that is formed in a second direction to intersect the first active fin F10.

An oxide film is formed below the first active fin F10. A first material (e.g., germanium) may be included in a region N of this oxide film where the first active fin F10 and the second gate line 352 do not overlap each other, and may not be included in the oxide film in a region O where the second gate line 352 and first active fin F10 overlap each other.

That is, the FOI structure is formed in the region N where the first active fin F10 and the second gate line 352 do not overlap each other, and germanium (Ge) may be included in the oxide film that is formed below the first active fin F10 in the region N where the first active fin F10 and the second gate line 352 do not overlap each other.

Further, a fin structure other than the FOI structure is formed in the region O where the first active fin F10 and the second gate line 352 overlap each other, and germanium (Ge) may not be included in the oxide film (or other insulating film) that is formed below the second gate line 352 in the region O where the first active fin F10 and the second gate line 352 overlap each other.

Hereinafter, other parts of the semiconductor device according to the eighth embodiment of the inventive concepts will be described in more detail with reference to FIGS. 11 to 13.

First, referring to FIG. 11, the semiconductor device according to the eighth embodiment of the inventive concepts may include a pair of inverters INV1 and INV2 that are connected in parallel between a power supply node Vcc and a ground node Vss. A first pass transistor PS1 and a second pass transistor PS2 are connected to the respective output nodes of the inverters INV1 and INV2.

The first pass transistor PS1 and the second pass transistor PS2 may be connected to a bit line BL and a complementary bit line/BL, respectively. The gates of the first pass transistor PS1 and the second pass transistor PS2 may be connected to a word line WL.

The first inverter INV1 includes a first pull-up transistor PU1 and a first pull-down transistor PD1 that are connected in series, and the second inverter INV2 includes a second pull-up transistor PU2 and a second pull-down transistor PD2 that are connected in series.

The first pull-up transistor PU1 and the second pull-up transistor PU2 may be PMOS transistors, and the first pull-down transistor PD1 and the second pull-down transistor PD2 may be NMOS transistors.

Further, in order that the first inverter INV1 and the second inverter INV2 constitute one latch circuit, the input node of the first inverter INV1 may be connected to the output node of the second inverter INV2, and the input node of the second inverter INV2 may be connected to the output node of the first inverter INV1.

Referring to FIGS. 11 to 13, the first active fin F10, a second active fin F20, a third active fin F30 and a fourth active fin F40, which are spaced apart from each other, may be formed to extend in a first direction (e.g., up-and-down direction of FIG. 12). The second active fin F20 and the third active fin F30 may have lengths that are shorter than lengths of the first active fin F10 and the fourth active fin F40.

Further, a first gate line 351, the second gate line 352, a third gate line 353 and a fourth gate line 354 are formed to extend in a second direction (e.g., left-to-right direction of FIG. 12) to intersect one or more of the first active fin F10 to the fourth active fin F40.

Specifically, the first gate line 351 may be formed to completely intersect the first active fin F10 and the second active fin F20, and to at least partially overlap the end of the third active fin F30. The third gate line 353 may be formed to completely intersect the fourth active fin F40 and the third active fin F30, and to at least partially overlap the end of the second active fin F20. The second gate line 352 and the fourth gate line 354 may be formed to intersect the first active fin F10 and the fourth active fin F40, respectively.

As shown in FIG. 12, the first pull-up transistor PU1 is defined at the intersection of the first gate line 351 and the second active fin F20. The first pull-down transistor PD1 is defined at the intersection of the first gate line 351 and the first active fin F10. The first pass transistor PS1 is defined at the intersection of the second gate line 352 and the first active fin F10.

The second pull-up transistor PU2 is defined at the intersection of the third gate line 353 and the third active fin F30. The second pull-down transistor PD2 is defined at the intersection of the third gate line 353 and the fourth active fin F40. The second pass transistor PS2 is defined at the intersection of the fourth gate line 354 and the fourth active fin F40.

Although not shown specifically, a recess may be formed on both sides of each of the intersections between the first to fourth gate lines 351 to 354 and the first to fourth active fins F10 to F40. In the recess, a source/drain may be formed, and a plurality of contacts 361 may be formed.

In addition, a shared contact 362 electrically connects the second active fin F20, the third gate line 353 and a wiring 371. A shared contact 363 electrically connects the third active fin F30, the first gate line 351 and a wiring 372.

The first pull-up transistor PU1, the first pull-down transistor PD1, the first pass transistor PS1, the second pull-up transistor PU2, the second pull-down transistor PD2 and the second pass transistor PS2 may, for example, be formed as semiconductor devices according to the above-described embodiments of the inventive concepts.

Hereinafter, a method for fabricating a semiconductor device according to some embodiments of the inventive concepts will be described.

Figure 14:
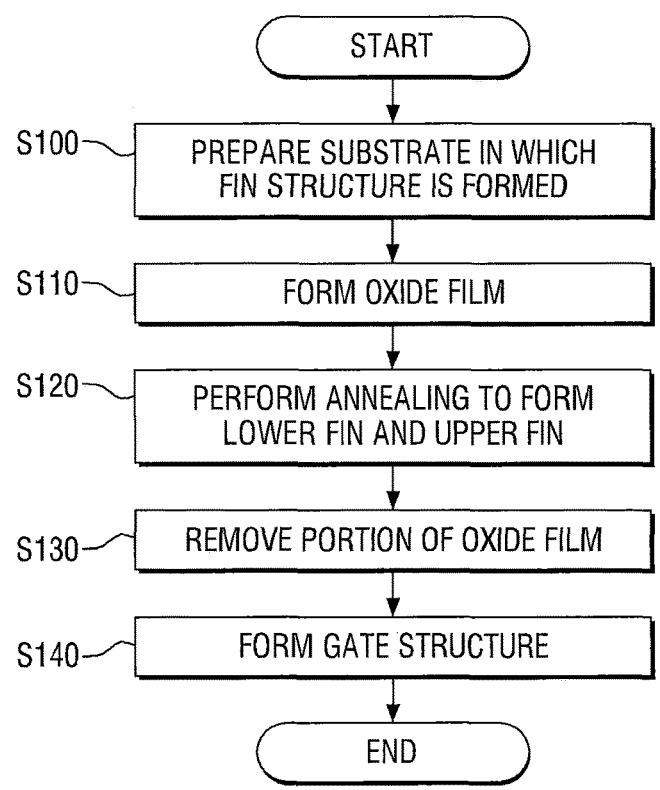
FIG. 14 is a flowchart illustrating a method for fabricating a semiconductor device according to one embodiment of the inventive concepts.
Figure 15:
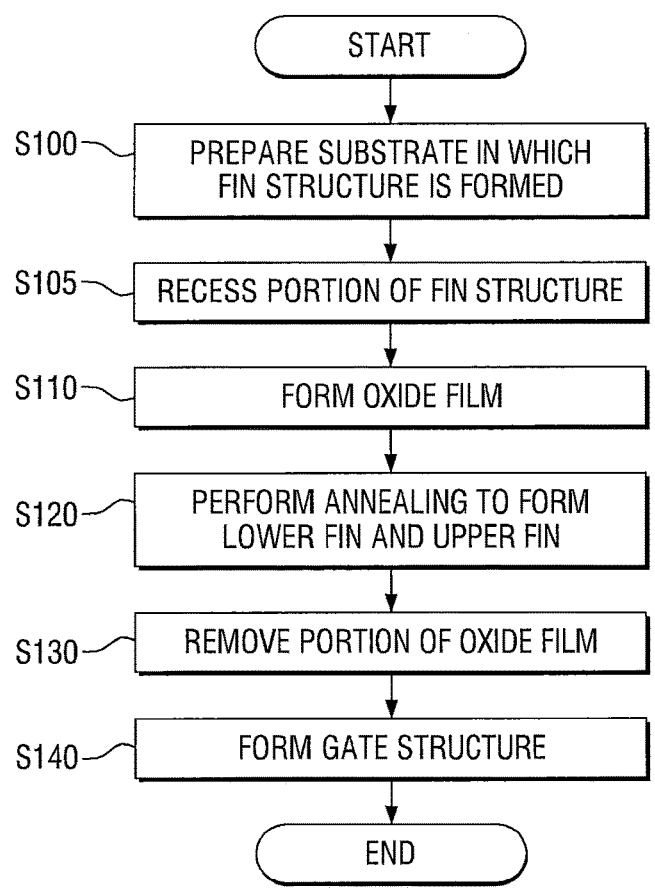
FIG. 15 is a flowchart illustrating a method for fabricating a semiconductor device according to another embodiment of the inventive concepts.
Figure 16:
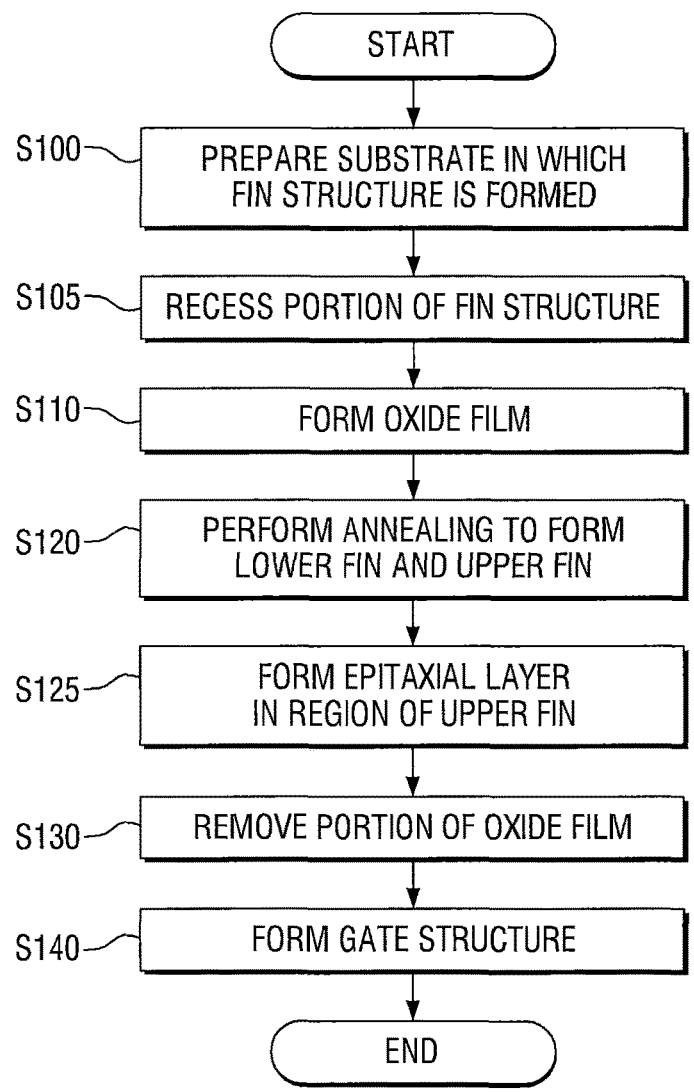
FIG. 16 is a flowchart illustrating a method for fabricating a semiconductor device according to still another embodiment of the inventive concepts.
Figure 29:
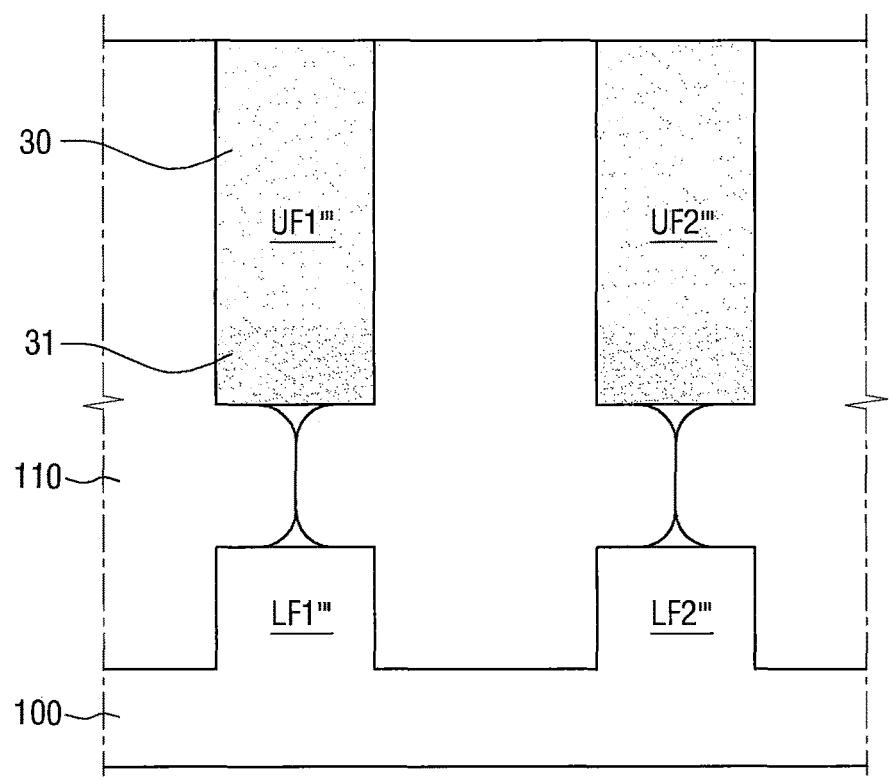
FIGS. 29 and 30 are diagrams showing intermediate structures formed in a method for fabricating a semiconductor device according to still another embodiment of the inventive concepts.
Figure 30:
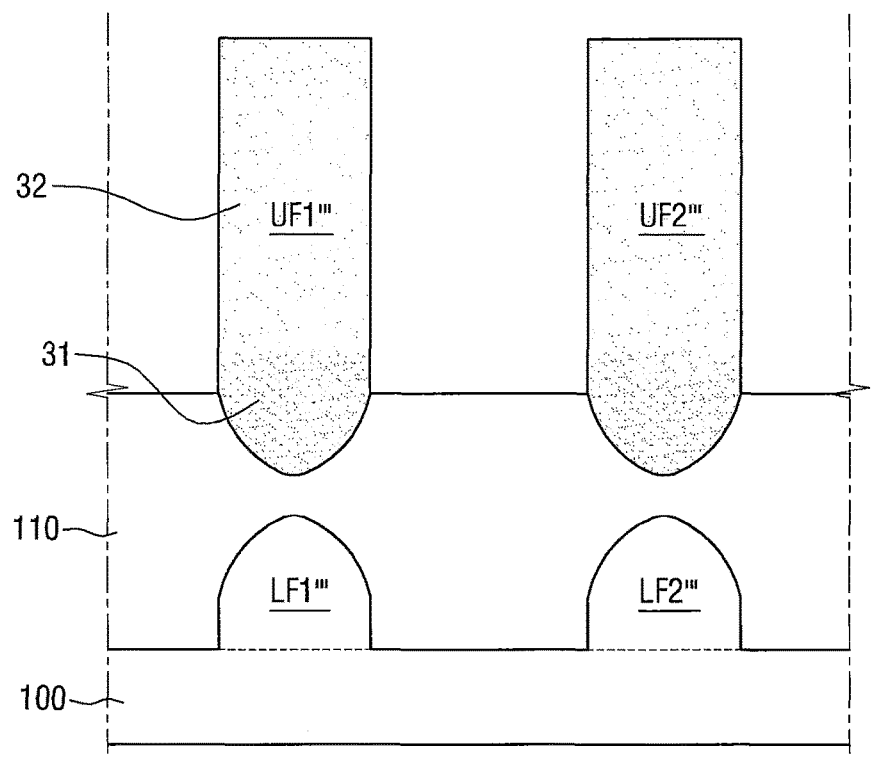

FIG. 14 is a flowchart illustrating a method for fabricating a semiconductor device according to an embodiment of the inventive concepts. FIG. 15 is a flowchart illustrating a method for fabricating a semiconductor device according to another embodiment of the inventive concepts. FIG. 16 is a flowchart illustrating a method for fabricating a semiconductor device according to still another embodiment of the inventive concepts. FIGS. 17 to 22 are diagrams showing intermediate structures formed in the method for fabricating a semiconductor device according to one embodiment of the inventive concepts. FIG. 23 is a diagram showing an intermediate structure formed in the method for fabricating a semiconductor device according to another embodiment of the inventive concepts. FIGS. 24 to 28 are diagrams showing intermediate structures formed in the method for fabricating a semiconductor device according to still another embodiment of the inventive concepts. FIGS. 29 and 30 are diagrams showing intermediate structures formed in the method for fabricating a semiconductor device according to still another embodiment of the inventive concepts.

Referring to FIGS. 14 and 17 to 22, in a method for fabricating a semiconductor device according to one embodiment of the inventive concepts, a substrate 100 is prepared that includes a fin structure formed thereon (step S100).

Figure 17:
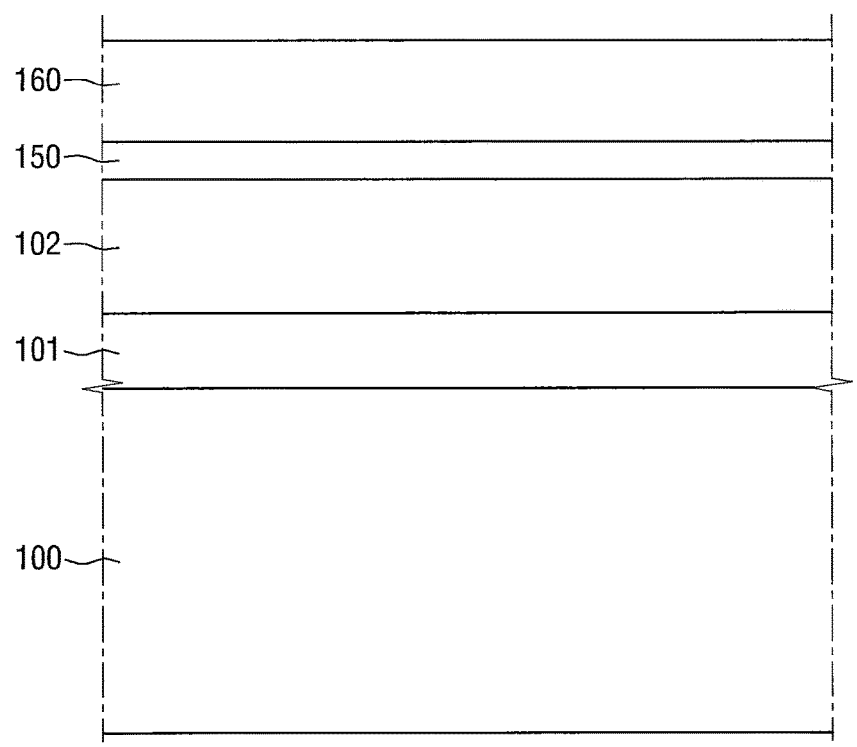
FIGS. 17 to 22 are diagrams showing intermediate structures formed in a method for fabricating a semiconductor device according to one embodiment of the inventive concepts.

Referring to FIG. 17, in order to form a fin structure on the substrate 100, a first material layer 101 and a second material layer 102 are sequentially formed on the substrate 100. Then, an etch stop film 150 is formed on the second material layer 102, and a mask film 160 is formed on the etch stop film 150.

Figure 18:
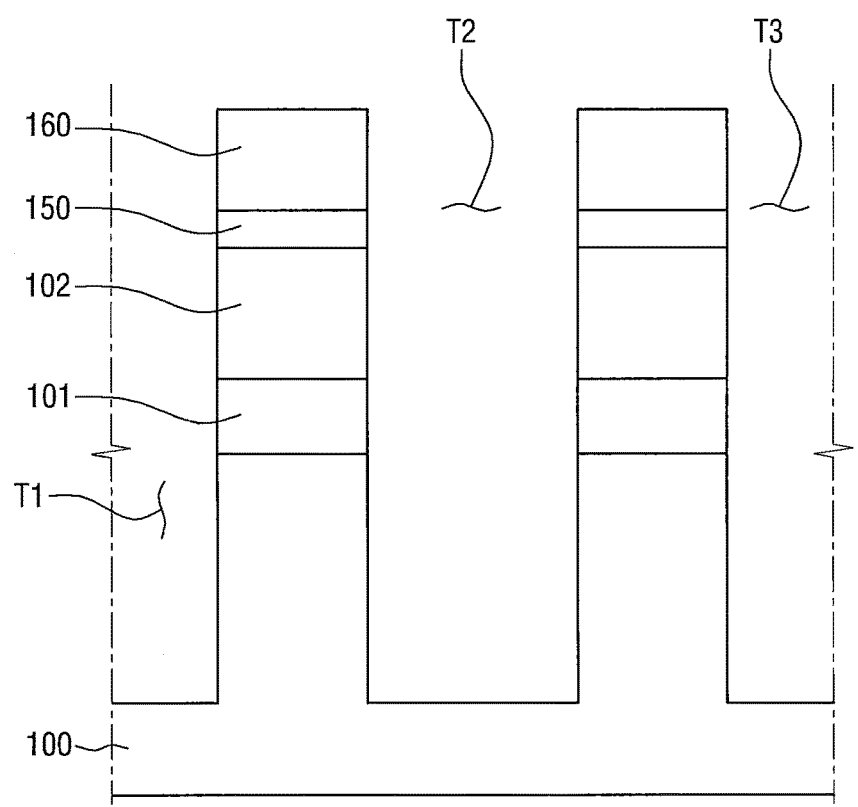

Referring to FIG. 18, trenches T1, T2 and T3 may then be formed so that one or more fin structures are formed that protrude from the substrate 100. The trenches T1, T2 and T3 may be formed by using, for example, a dry etching process.

In this case, the substrate 100 and the second material layer 102 may include silicon (Si), and the first material layer 101 may include silicon germanium (SiGe).

Figure 19:
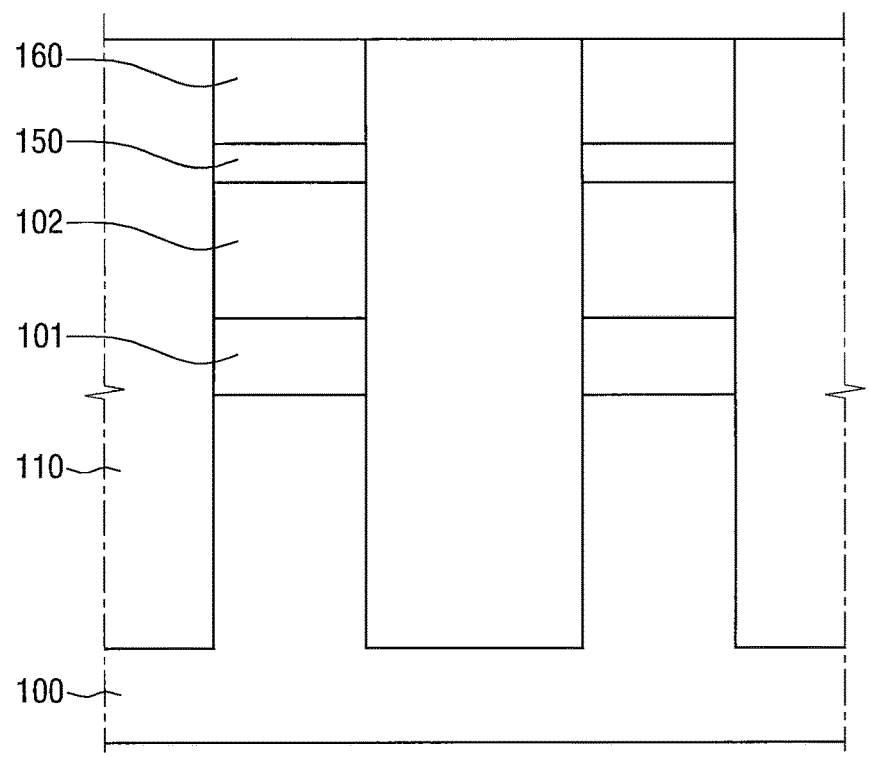

Subsequently, an oxide film 110 is formed on the substrate 100 to cover at least a portion of the fin structure (step S110). The oxide film 110 may cover the entire side surfaces of the first material layer 101 on the substrate 100, and may also cover a portion of the second material layer 102. FIG. 19 shows a case where the oxide film 110 covers the entire side surfaces of the fin structure, but it will be understood that FIG. 19 is an exemplary diagram.

Figure 20:
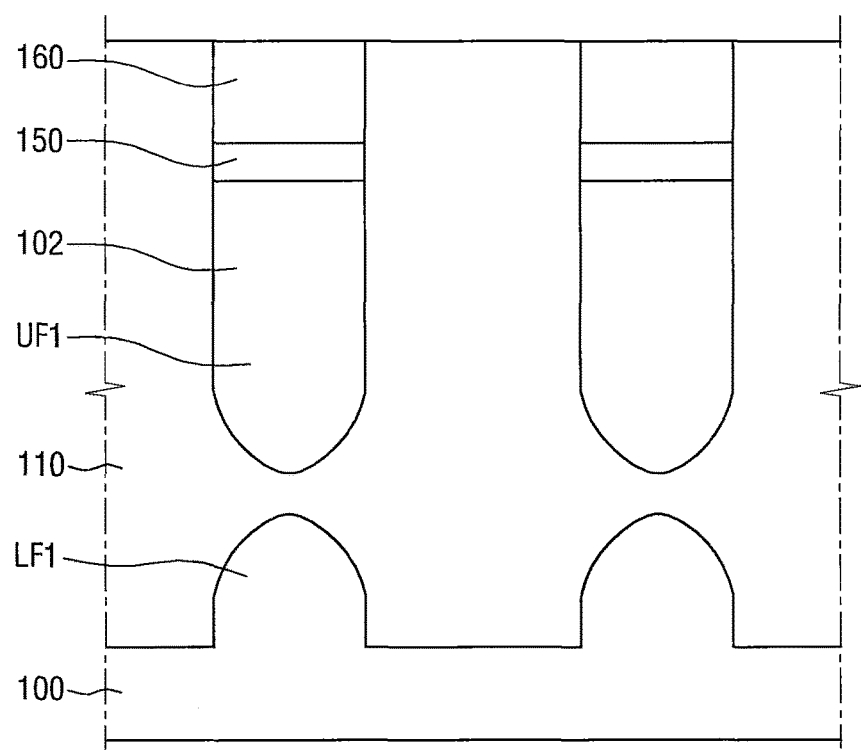

Referring to FIG. 20, the fin structure is then annealed to form a lower fin LF1 and an upper fin UF1 (step S120). In order to separate the lower fin LF1 from the upper fin UF1, the first material layer 101 is oxidized and converted into an oxide film. That is, since the first material layer 101 includes silicon germanium (SiGe) and the substrate 100 and the second material layer 102 include silicon (Si), the first material layer 101 is converted into the oxide film that serves as an insulating film earlier than the second material layer 102 due to a difference in oxidation rate between silicon germanium (SiGe) and silicon (Si).

Figure 21:
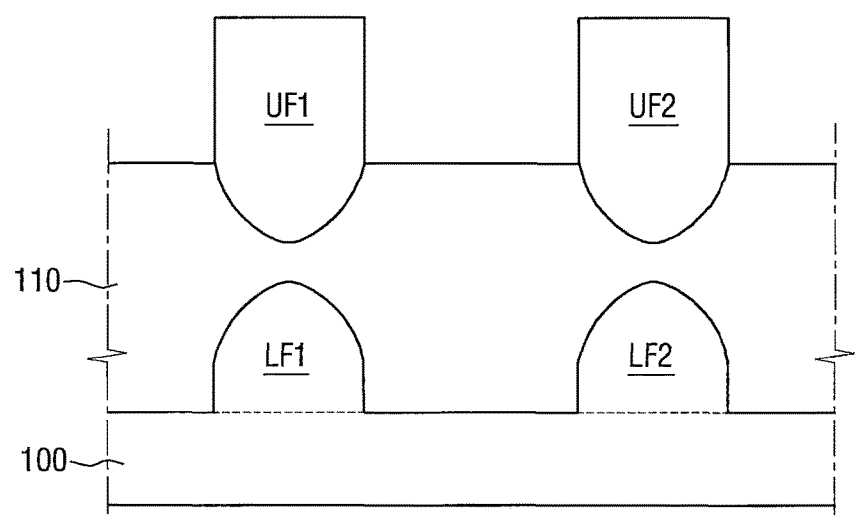

Referring to FIG. 21, subsequently, a portion of the oxide film 110 is removed. A portion of the upper fin UF1 may be recessed in the upper surface of the oxide film 110 (step S130).

Then, a gate structure is formed in a direction to intersect the upper fin UF1 (step S140).

Figure 22:
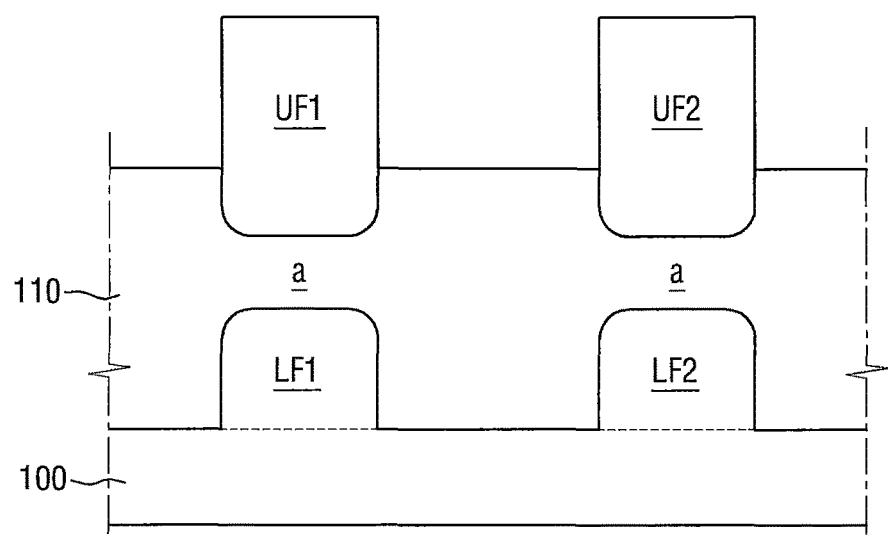
Figure 23:
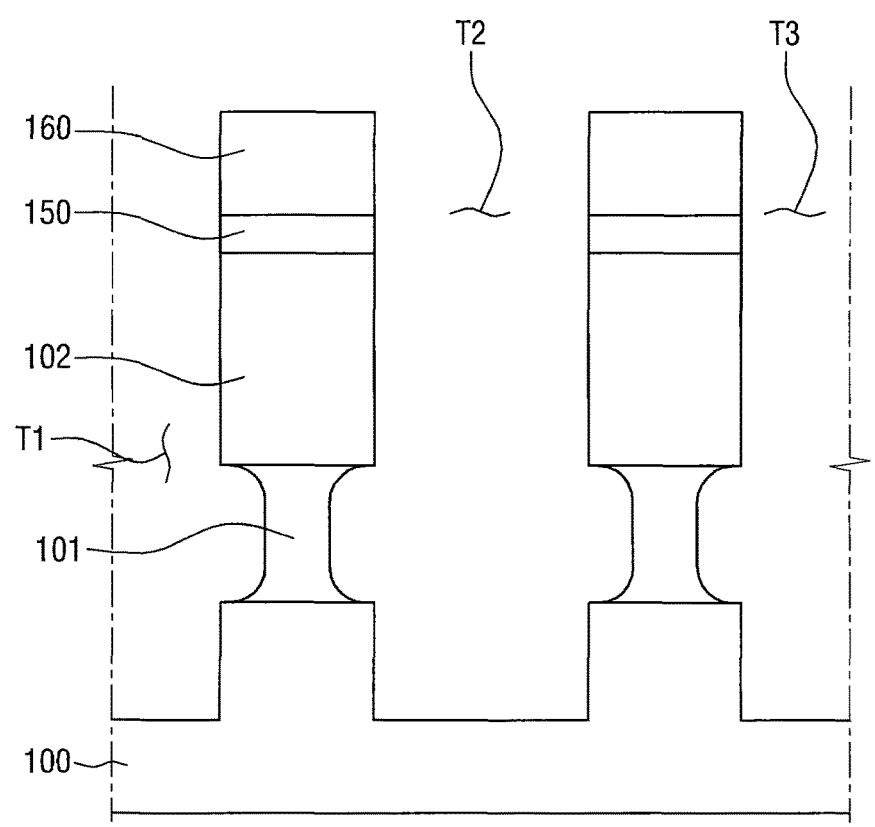
FIG. 23 is a diagram showing an intermediate structure formed in step a method for fabricating a semiconductor device according to another embodiment of the inventive concepts.

Referring to FIG. 22, in some embodiments, the annealing process that is used to form the lower fin LF1 and the upper fin UF1 may include a first anneal process and a second anneal. The first material layer 101 may be converted into an oxide film by the first anneal, and the upper surface of the lower fin LF1 and the lower surface of the upper fin UF1 may be formed to have a smooth curved surface by the second anneal. Further, a concentration gradient of germanium (Ge) may be made uniform by the second annealing process.

The second annealing process may be performed at a higher temperature than the first annealing process. For example, the second annealing process may be a laser annealing process.

Referring to FIGS. 15 and 23, a method for fabricating a semiconductor device according to another embodiment of the inventive concepts further includes, before forming the oxide film 110, recessing the first material layer 101 included in the fin structure (step S105).

A recess process may be performed to remove a portion of the side surface of the first material layer 101. Accordingly, in the subsequent step, it is possible to increase a speed at which the first material layer 101 is converted into the oxide film.

Referring to FIGS. 16 and 24 to 30, a method for fabricating a semiconductor device according to still another embodiment of the inventive concepts further includes, after forming the upper fin UF" (UF'"), forming an epitaxial layer in a region of the upper fin UF" (UF'") (step S125).

Figure 24:
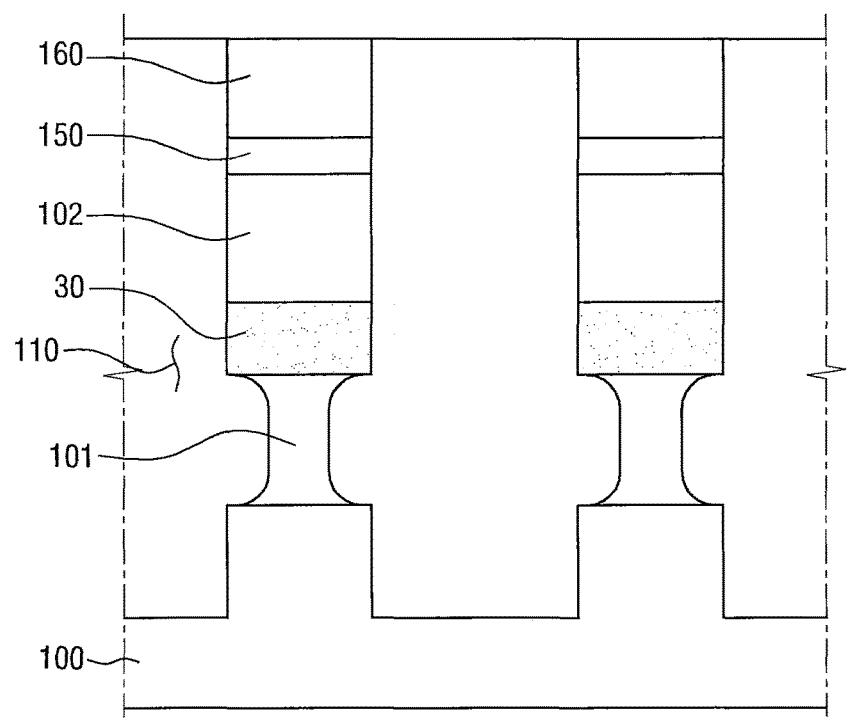
FIGS. 24 to 28 are diagrams showing intermediate structures formed in a method for fabricating a semiconductor device according to still another embodiment of the inventive concepts.

Referring to FIG. 24, when the first material layer 101 is formed on the substrate 100, the first material layer 101 may be formed such that the concentration of silicon germanium (SiGe) is high in a middle portion of the first material layer 101 by varying the concentration of silicon (Si) in the silicon germanium (SiGe) layer as a function of height above the underlying substrate (i.e., in the direction of the fin structure). As shown in FIG. 24, in such embodiments, after the annealing process is performed a material layer 30 that is not converted into an oxide film may be provided on top of the first material layer 101 that is converted into the oxide film by the annealing process. The material layer 30 may comprise, for example, germanium (Ge). In embodiments where the first material layer 101 is silicon germanium (SiGe), the middle portion of the first material layer 101 may have a silicon concentration such the silicon germanium (SiGe) layer will quickly oxidize during the anneal in the oxidizing environment, while the upper portion of the first material layer 101 may have a silicon concentration such that the silicon germanium (SiGe) layer will be slow to oxidize during the anneal in the oxidizing environment.

Since the oxidation rate is higher in the middle portion of the silicon germanium (SiGe) layer than in the upper portion of the silicon germanium (SiGe) layer, the fin structure may be separated in the middle portion of the first material layer 101 into upper and lower fins, as shown in FIG. 24 and the upper portion of the first material layer 101 may remain as part of the upper fin structure.

Figure 25:
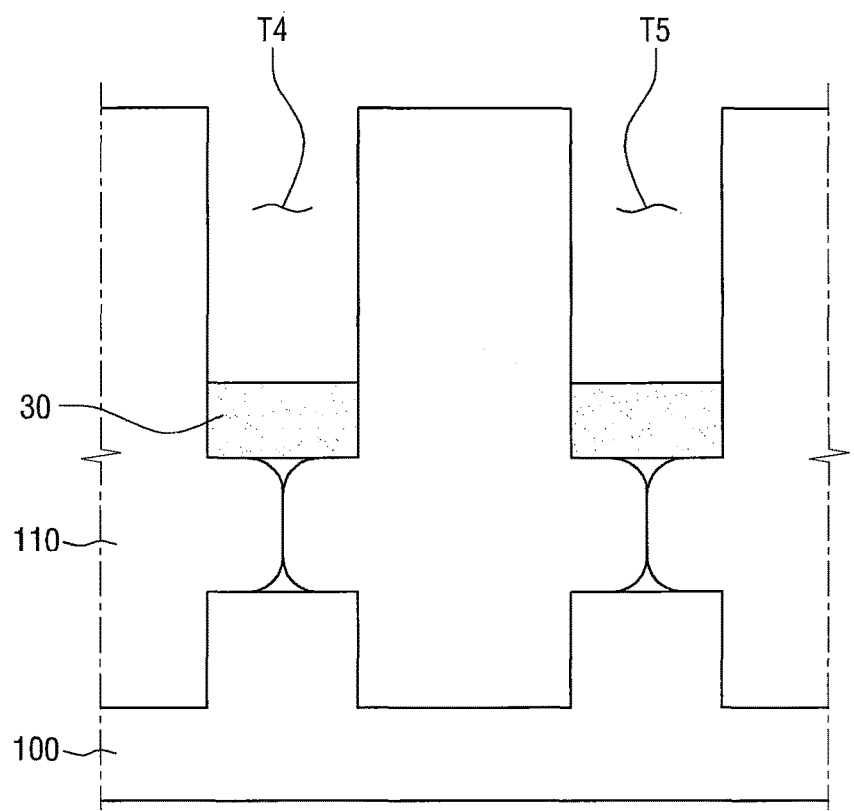

Then, referring to FIG. 25, the second material layer 102, the etch stop film 150 and the mask film 160 are removed from an upper region of the fin structure, and trenches T4 and T5 are formed.

Figure 26:
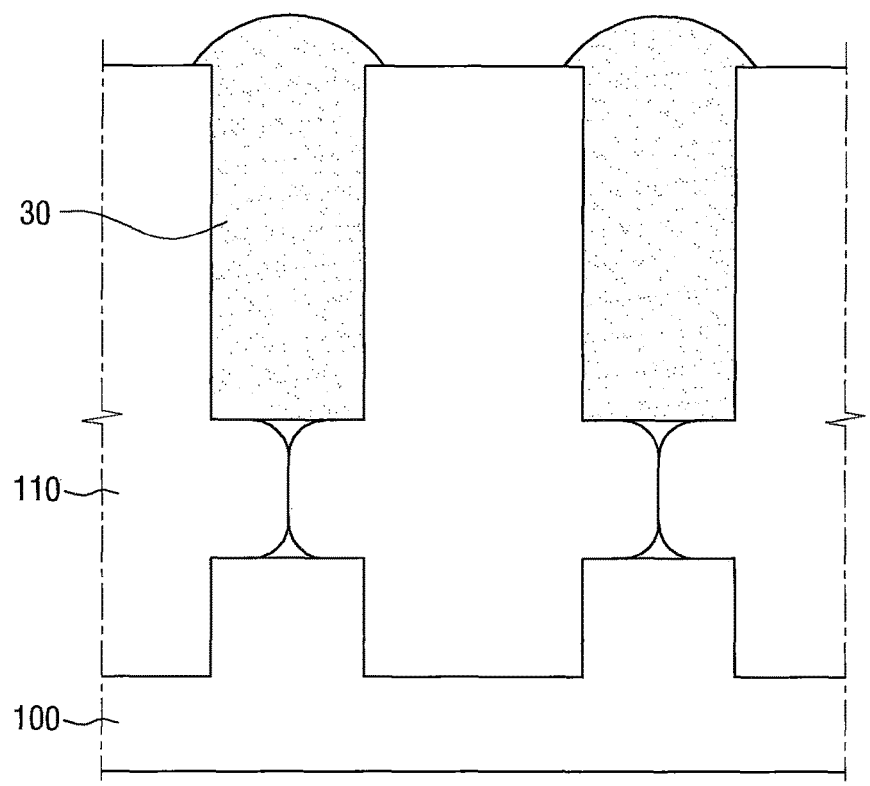
Figure 27:
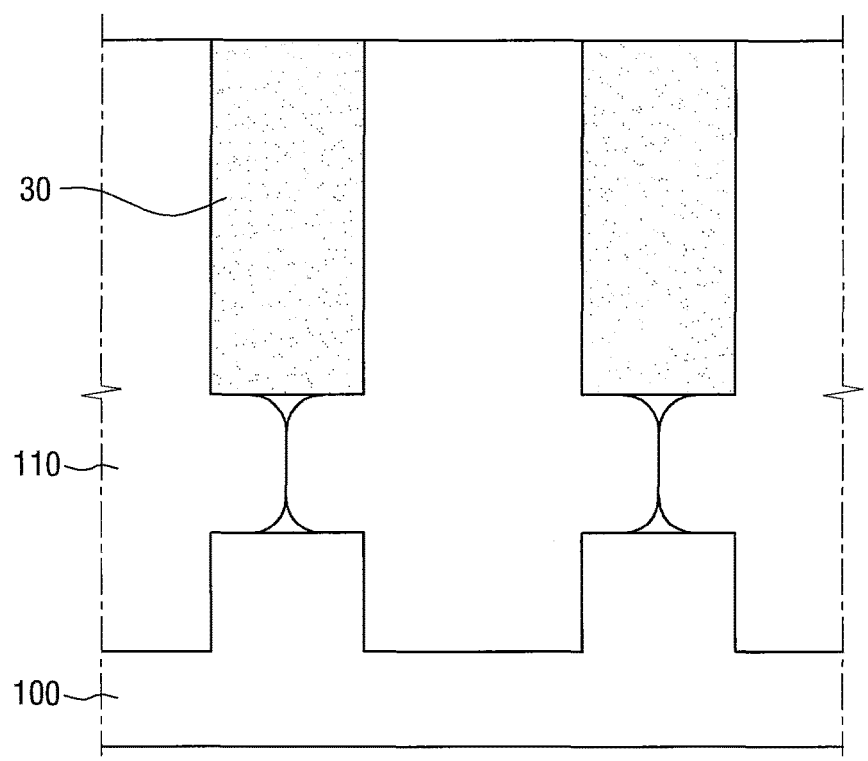

Referring to FIG. 26, the same material (e.g., germanium (Ge)) as the material included in the first material layer 101 is filled in the trenches T4 and T5 via an epitaxial process, and an upper portion of the material filled in the trenches T4 and T5 is removed via a planarization process (see FIG. 27).

Figure 28:
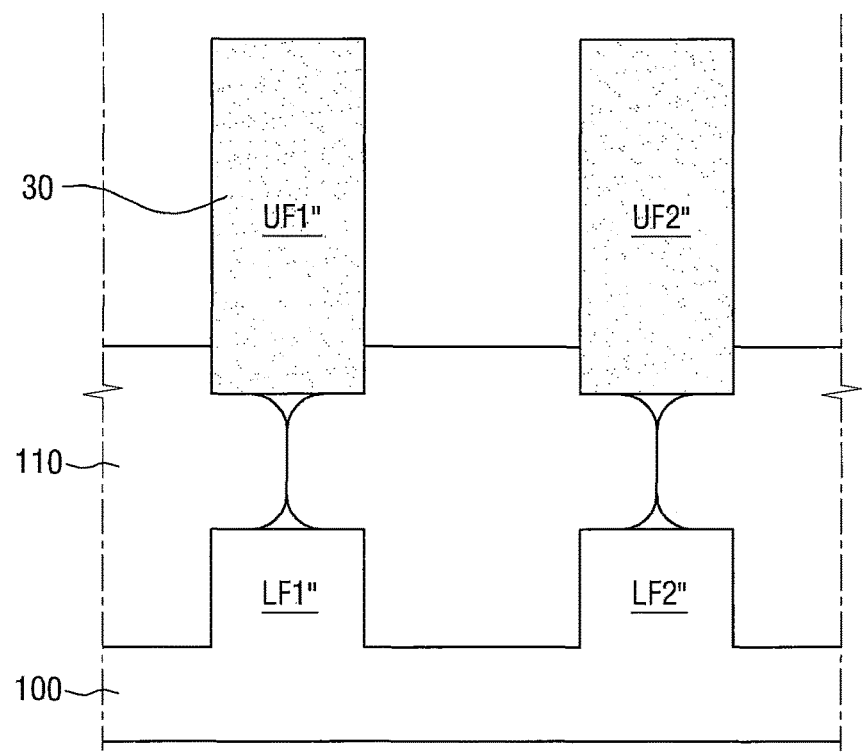

Then, referring to FIG. 28, the FOI structure having the upper fin UF1" and the lower fin LF1" is formed by removing a portion of the oxide film 110. In this case, germanium (Ge) is included in the upper fin UF1".

Referring to FIGS. 29 and 30, in other embodiments, an FOI structure having an upper fin UF1'" and a lower fin LF1'" may be formed by removing the material that forms the initial upper fin and then using an epitaxial process to form a second material layer 31, and then forming a third material 32 (e.g., III-V group compound semiconductor material), which is different from the material included in the first material layer 101, on the second material 31. As shown in FIG. 30, an upper portion of the oxide film 110 may then be removed. In this case, a III-V group compound semiconductor material is included in the upper fin UF'".

Figure 31:
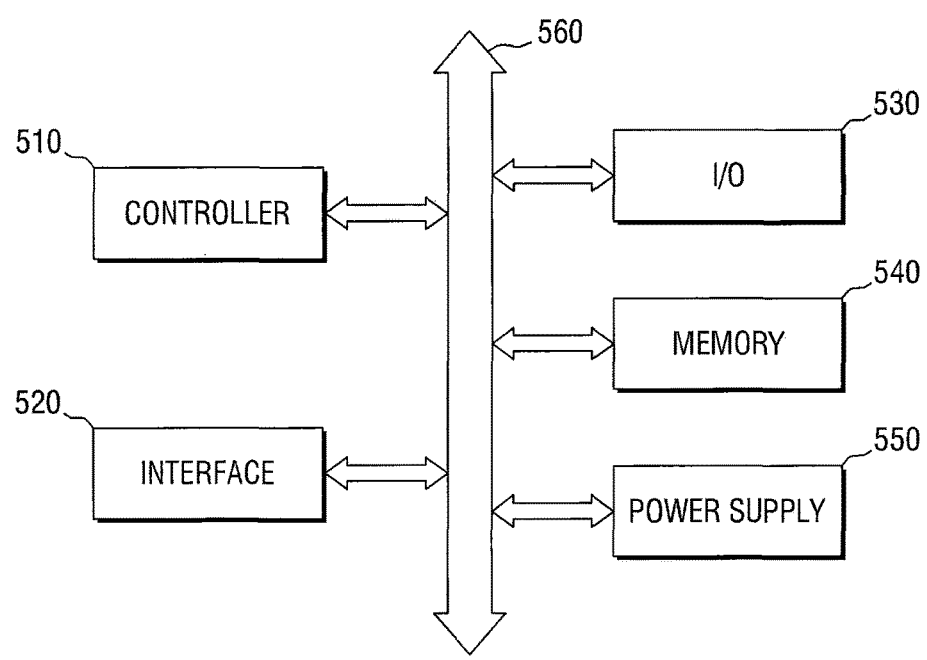
FIG. 31 is a schematic block diagram of an electronic system including a semiconductor device according to some embodiments of the inventive concepts.

Hereinafter, an electronic system 500 that includes a semiconductor device according to some embodiments of the inventive concepts will be described. FIG. 31 is a schematic block diagram of the electronic system 500.

Referring to FIG. 31, the electronic system 500 may include a controller 510, an interface 520, an input/output (I/O) device 530, a memory device 540, a power supply device 550, and a bus 560.

The controller 510, the interface 520, the I/O device 530, the memory device 540, and the power supply device 550 may be connected to each other through the bus 560. The bus 560 corresponds to a path through which data may be transmitted.

The controller 510 may include at least one of a microprocessor, a micro-controller and other logic devices capable of performing similar functions to process data.

The interface 520 may serve to transmit/receive data to/from a communication network. The interface 520 may be a wired or a wireless interface. For example, the interface 520 may include an antenna or a wired/wireless transceiver or the like.

The I/O device 530 may include a keypad, a display device and the like to input and output data.

The memory device 540 may store data and/or commands. The semiconductor devices according to some embodiments of the inventive concepts may be included as some components of the memory device 540.

The power supply device 550 may convert power that is input from an external source and supply the power to each of the components 510 to 540.

Figure 32:
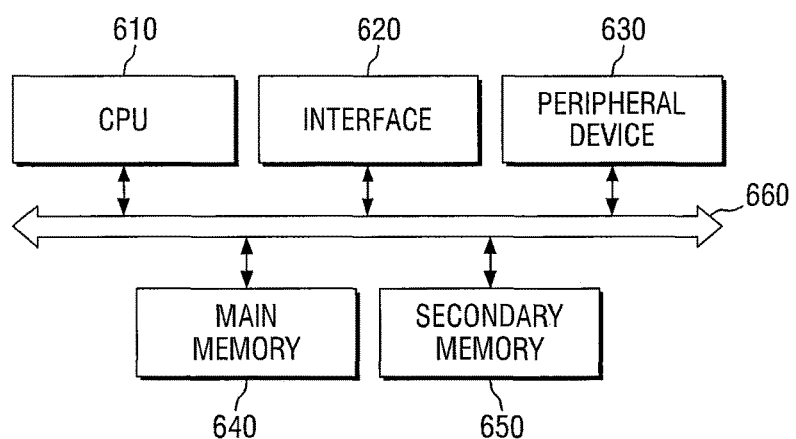
FIG. 32 is a schematic block diagram for explaining an application example of an electronic system including a semiconductor device according to some embodiments of the inventive concepts.

FIG. 32 is a schematic block diagram for explaining an application example of an electronic system including a semiconductor device according to some embodiments of the inventive concepts.

Referring to FIG. 32, the electronic system may include a central processing unit (CPU) 610, an interface 620, a peripheral device 630, a main memory device 640, a secondary memory device 650, and a bus 660.

The CPU 610, the interface 620, the peripheral device 630, the main memory device 640, and the secondary memory device 650 may be connected to each other through the bus 660. The bus 660 corresponds to a path through which data may be transmitted.

The CPU 610 may include a control device, a computing device or the like that executes a program and process data.

The interface 620 may transmit/receive data to/from a communication network. The interface 620 may be a wired or a wireless interface. For example, the interface 620 may include an antenna or a wired/wireless transceiver or the like.

The peripheral device 630 may include a mouse, a keyboard, a display device, a printer device and the like to input and output data.

The main memory device 640 may transmit/receive data to/from the CPU 610, and store data and/or commands and the like required for executing the program. Semiconductor devices according to embodiments of the inventive concepts may be provided as some components of the main memory device 640.

The secondary memory device 650 may include a nonvolatile storage device such as a magnetic tape, magnetic disk, floppy disk, hard disk and optical disk to store data and/or commands and the like. The secondary memory device 650 can store data even when the power supply of the electronic system is shut off.

The semiconductor device according to some embodiments of the inventive concepts may be provided as one of various components of an electronic apparatus such as a computer, ultra mobile PC (UMPC), workstation, net-book, personal digital assistant (PDA), portable computer, web tablet, wireless phone, mobile phone, smart phone, e-book, portable multimedia player (PMP), portable game console, navigation device, black box, digital camera, 3-dimensional television, digital audio recorder, digital audio player, digital picture recorder, digital picture player, digital video recorder, digital video player, apparatus capable of transmitting and receiving information in wireless environment, one of various electronic apparatuses constituting a home network, one of various electronic apparatuses constituting a computer network, one of various electronic apparatuses constituting a telematics network, RFID device, and one of various components forming a computing system.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for fabricating a semiconductor device, comprising:
   preparing a substrate that has a fin structure that includes a first material layer and a second material layer protruding upwardly therefrom;
   forming an oxide film on the substrate and on at least a portion of the fin structure;
   annealing the fin structure to convert the fin structure into a lower fin and an upper fin that is spaced apart from the lower fin;
   removing a portion of the oxide film; and
   forming a gate structure on the upper fin that intersects the upper fin.

2. The method of claim 1, further comprising, before forming the oxide film, recessing the first material layer that is included in the fin structure.

3. The method of claim 2, wherein recessing the first material layer includes removing a portion of a side surface of the first material layer.

4. The method of claim 1, wherein the fin structure includes an upwardly protruding portion of the substrate, the first material layer that is on the upwardly protruding portion of the substrate, and the second material layer that is on the first material layer opposite the upwardly protruding portion of the substrate, and
   wherein the first material layer includes a material that is not included in the second material layer or in the upwardly protruding portion of the substrate.

5. The method of claim 4, wherein the second material layer includes germanium (Ge).

6. The method of claim 4, wherein the upwardly protruding portion of the substrate and the second material layer include different materials.

7. The method of claim 1, wherein annealing the fin structure to convert the fin structure into the lower fin and the upper fin that is spaced apart from the lower fin comprises:
   sequentially performing a first annealing process and a second annealing process, wherein the second annealing process is performed at a higher temperature than the first annealing process.

8. The method of claim 7, wherein a curved portion is formed in an upper portion of the lower fin and a lower portion of the upper fin by the second annealing process.

9. The method of claim 1, wherein the upper fin includes a portion of the second material layer,
   and further comprising:
   before removing a portion of the oxide film, removing the second material layer included in the upper fin; and
   forming an epitaxial layer on the second material layer which is exposed.

10. The method of claim 9, wherein the epitaxial layer is formed by performing an epitaxial process using the second material layer as a seed layer.

11. The method of claim 10, wherein the epitaxial layer includes germanium or III-V group compound semiconductor material.

12. The method of claim 1, wherein the first material layer includes silicon germanium (SiGe).

13. The method of claim 12, wherein the first material layer is formed by varying a concentration of silicon (Si) in the first material layer as a function of height above the substrate.

14. The method of claim 1, wherein an upper surface of the lower fin and a bottom surface of the upper fin are substantially parallel to each other.

15. A method for fabricating a semiconductor device, comprising:
    forming a lower fin that protrudes upwardly from a substrate and that extends in a first direction;
    forming an upper fin that extends in the first direction above the lower fin;
    forming an oxide film that includes germanium (Ge) between the lower fin and the upper fin to electrically separate the upper fin from the lower fin; and
    forming a gate structure on the upper fin that extends in a second direction to intersect the upper fin,
    wherein an upper surface of the lower fin and a bottom surface of the upper fin are substantially parallel to each other.

16. The method of claim 15, wherein forming the oxide film comprises:
    performing a first annealing process to oxidize silicon germanium (SiGe) layer; and
    performing a second annealing process at a higher temperature than the first annealing process, after performing the first annealing process.

17. The method of claim 16, wherein the second annealing process is a laser annealing process.

18. The method of claim 15, wherein forming the upper fin comprises:
    forming a first material layer that includes silicon germanium (SiGe); and
    forming a second material layer that is free of germanium on the first material layer.

19. The method of claim 18, wherein the second material layer comprises a III-V group compound semiconductor material.

20. The method of claim 15, wherein the lower fin and the upper fin comprise different materials.

* * * * *